(12) United States Patent
Lin et al.

(10) Patent No.: US 11,587,887 B2
(45) Date of Patent: Feb. 21, 2023

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Yu-Wei Lin, New Taipei (TW); Chun-Yen Lan, Hsinchu (TW); Tzu-Ting Chou, Hsinchu (TW); Tzu-Shiun Sheu, Hsinchu (TW); Chih-Wei Lin, Hsinchu County (TW); Shih-Peng Tai, Hsinchu County (TW); Wei-Cheng Wu, Hsinchu (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 102 days.

(21) Appl. No.: 17/148,572

(22) Filed: Jan. 14, 2021

(65) Prior Publication Data
US 2022/0223542 A1 Jul. 14, 2022

(51) Int. Cl.
| *H01L 23/16* | (2006.01) |
| *H01L 23/00* | (2006.01) |
| *H01L 23/367* | (2006.01) |
| *H01L 23/538* | (2006.01) |
| *H01L 21/48* | (2006.01) |

(52) U.S. Cl.
CPC ........ *H01L 23/562* (2013.01); *H01L 21/4853* (2013.01); *H01L 21/4857* (2013.01); *H01L 21/4871* (2013.01); *H01L 23/16* (2013.01); *H01L 23/3672* (2013.01); *H01L 23/5383* (2013.01); *H01L 23/5386* (2013.01); *H01L 23/5389* (2013.01)

(58) Field of Classification Search
CPC . H01L 2924/171–17798; H01L 23/562; H01L 21/4853; H01L 21/4857; H01L 21/4871; H01L 23/16; H01L 23/3672; H01L 23/5383; H01L 23/5386; H01L 23/5389
See application file for complete search history.

(56) References Cited

U.S. PATENT DOCUMENTS

| 8,993,380 B2 | 3/2015 | Hou et al. |
| 9,000,584 B2 | 4/2015 | Lin et al. |
| 9,048,222 B2 | 6/2015 | Hung et al. |
| 9,048,233 B2 | 6/2015 | Wu et al. |

(Continued)

FOREIGN PATENT DOCUMENTS

WO   WO-2021217319 A1 * 11/2021

*Primary Examiner* — Selim U Ahmed
*Assistant Examiner* — Evan G Clinton
(74) *Attorney, Agent, or Firm* — JCIPRNET

(57) ABSTRACT

A semiconductor device includes a circuit substrate, a semiconductor package, and a package frame. The semiconductor package is disposed on the circuit substrate. The package frame is disposed over the circuit substrate. The package frame encircles the semiconductor package. The semiconductor package has a first surface facing the circuit substrate and a second surface opposite to the first surface. The package frame leaves exposed at least a portion of the second surface of the semiconductor package. The package frame forms a cavity, which cavity encircles the semiconductor package.

20 Claims, 22 Drawing Sheets

(56) References Cited

U.S. PATENT DOCUMENTS

| | | |
|---|---|---|
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2009/0200659 A1* | 8/2009 | Tosaya .................... H01L 23/04 257/E23.181 |
| 2016/0013115 A1* | 1/2016 | Vadhavkar .............. H01L 25/16 257/713 |
| 2020/0411448 A1* | 12/2020 | Goh ................. H01L 23/49816 |

* cited by examiner

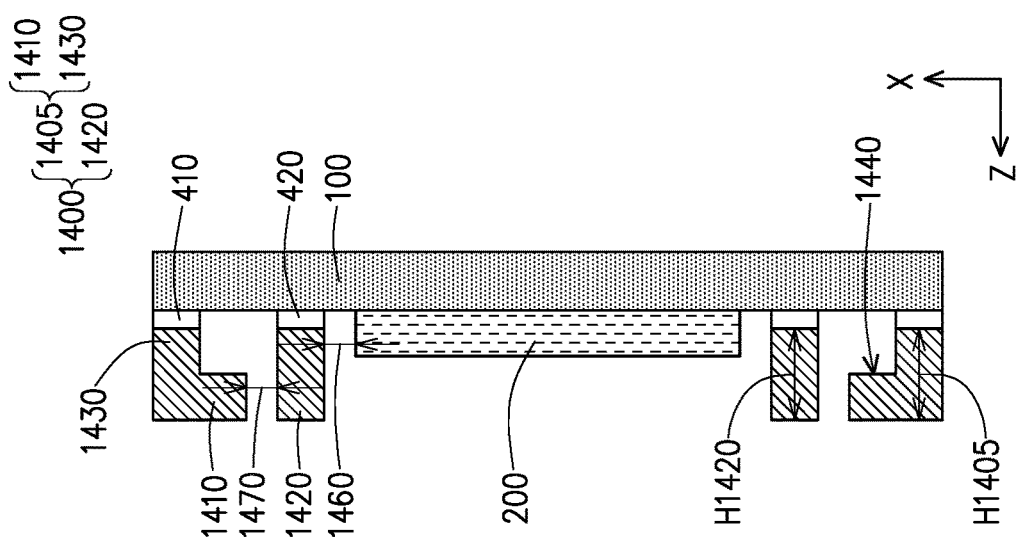
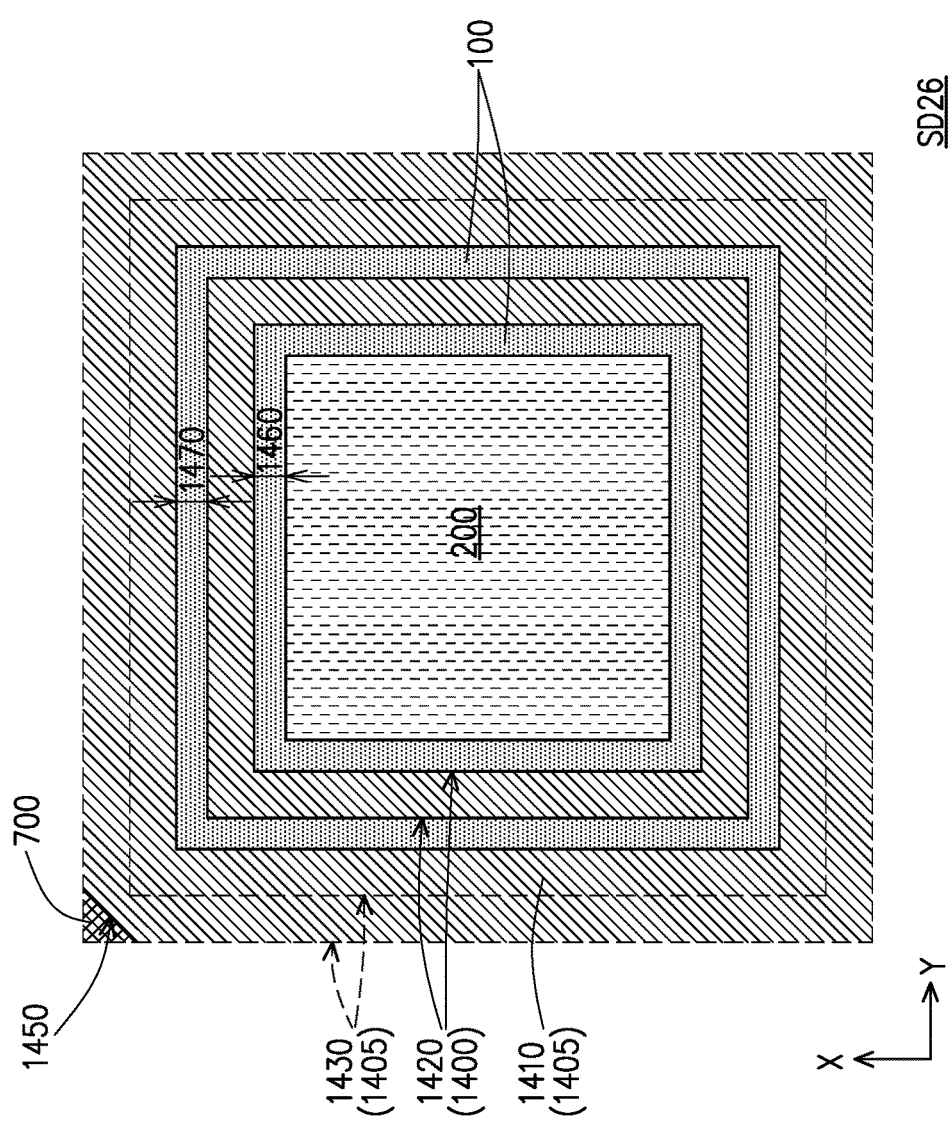
FIG. 7B
FIG. 7A

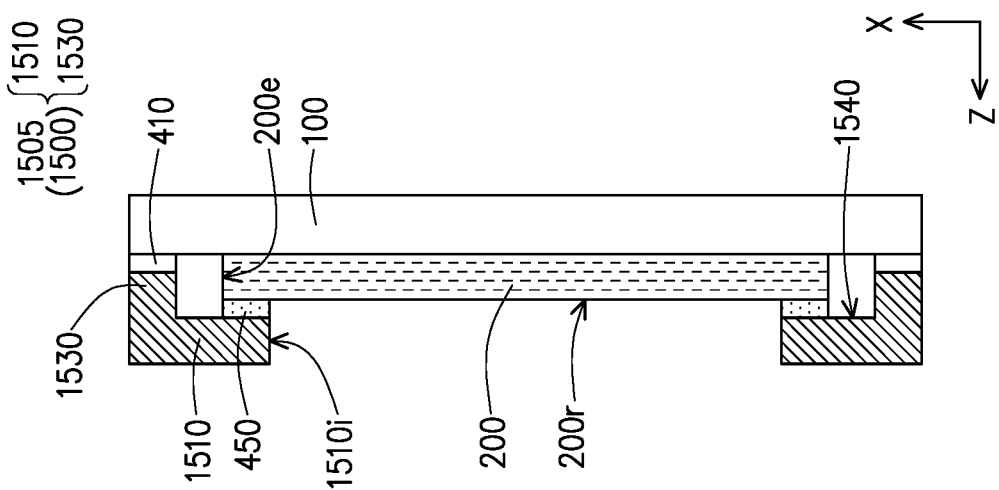
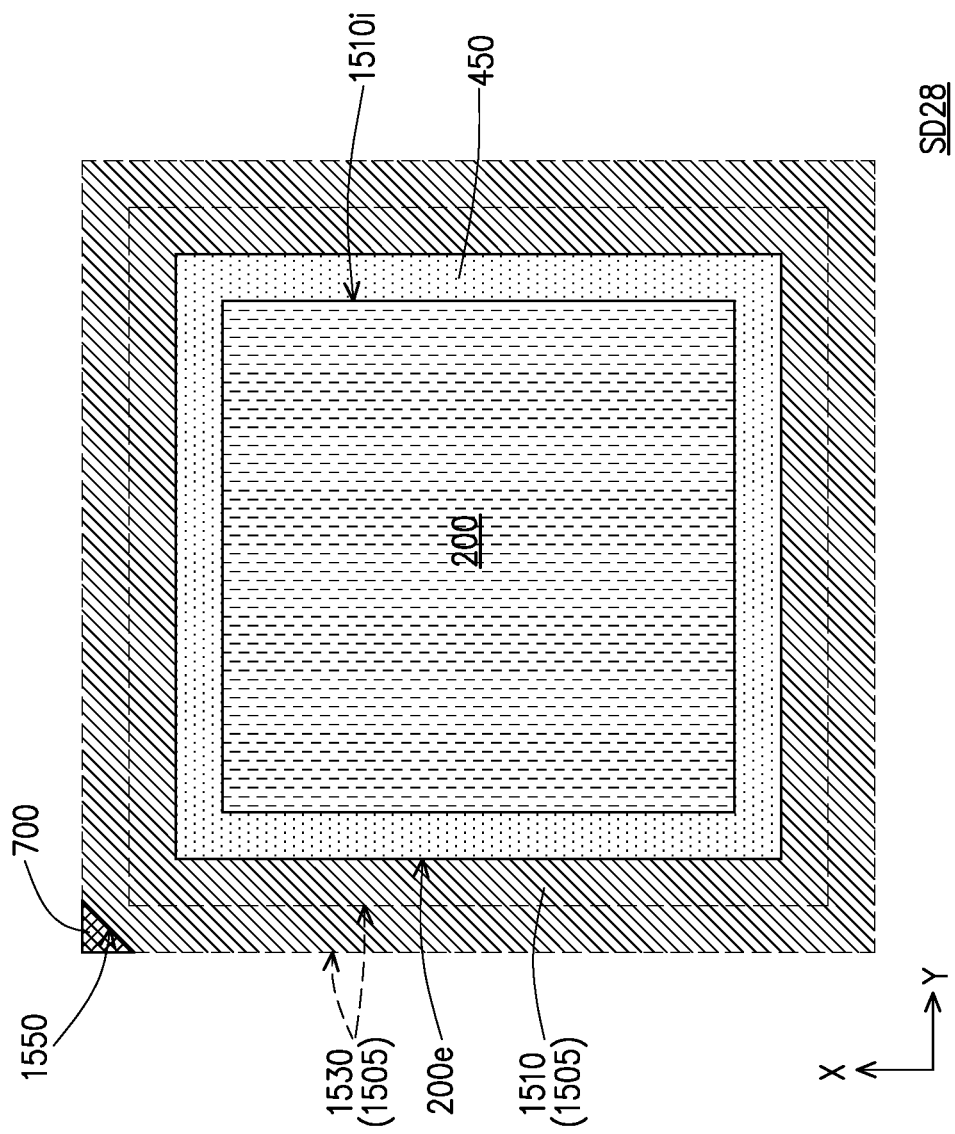
FIG. 8B
FIG. 8A

SEMICONDUCTOR DEVICE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed, and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A to FIG. 9A are schematic top views of semiconductor devices according to some embodiments of the disclosure.

FIG. 4B to FIG. 9B are schematic side views of the semiconductor devices of FIG. 4A to FIG. 9A, respectively, according to some embodiments of the disclosure.

DETAILED DESCRIPTION

Figure 1A:
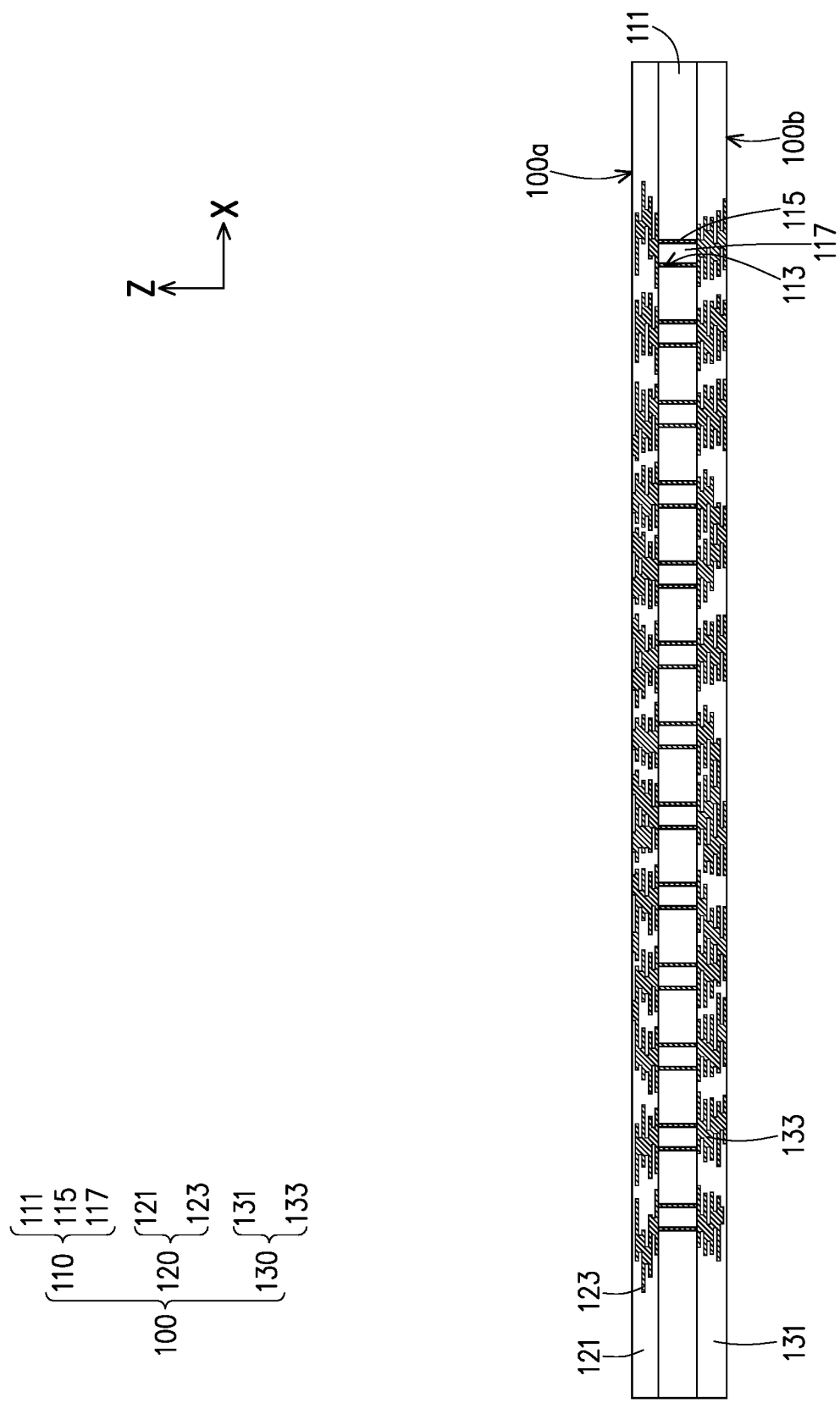
FIG. 1A to FIG. 1D are schematic cross-sectional views of structures produced at various stages of a manufacturing method of a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1D are schematic cross-sectional views of structures produced at various stages of a manufacturing method of a semiconductor device SD10 according to some embodiments of the present disclosure. Referring to FIG. 1A, in some embodiments a circuit substrate 100 is provided. In some embodiments, the circuit substrate 100 includes a core layer 110 and build-up layers 120, 130 disposed on opposite sides of the core layer 110. In some embodiments, the core layer 110 includes a dielectric layer 111 having through holes 113 which extend through the dielectric layer 111 from side to side. The through holes 113 may be lined with conductive material forming the through vias 115. In some embodiments, the through vias 115 only partially fill (e.g., line the edges of) the through holes 113, which are filled by a dielectric filling 117. In some alternative embodiments, the through holes 113 are filled by the through vias 115. In some embodiments, each build-up layer 120 or 130 respectively includes a dielectric layer 121 or 131 and conductive patterns 123 or 133 embedded in the corresponding dielectric layer 121 or 131 and providing electrical connection between opposite sides of the corresponding dielectric layer 121 or 131. In some embodiments, the build-up layers 120, 130 may independently include more or fewer dielectric layers 121, 131 and conductive patterns 123, 133 than what is illustrated in FIG. 1A, according to routing requirements. In some embodiments, the through vias 115 establish electrical connection between the conductive patterns 123 of one build-up layer 120 with the conductive patterns 133 of the other build-up layer 130. In some embodiments, at least one of the build-up layers 120, 130 (e.g., the build-up layer 120) is exposed for further processing.

Figure 1B:
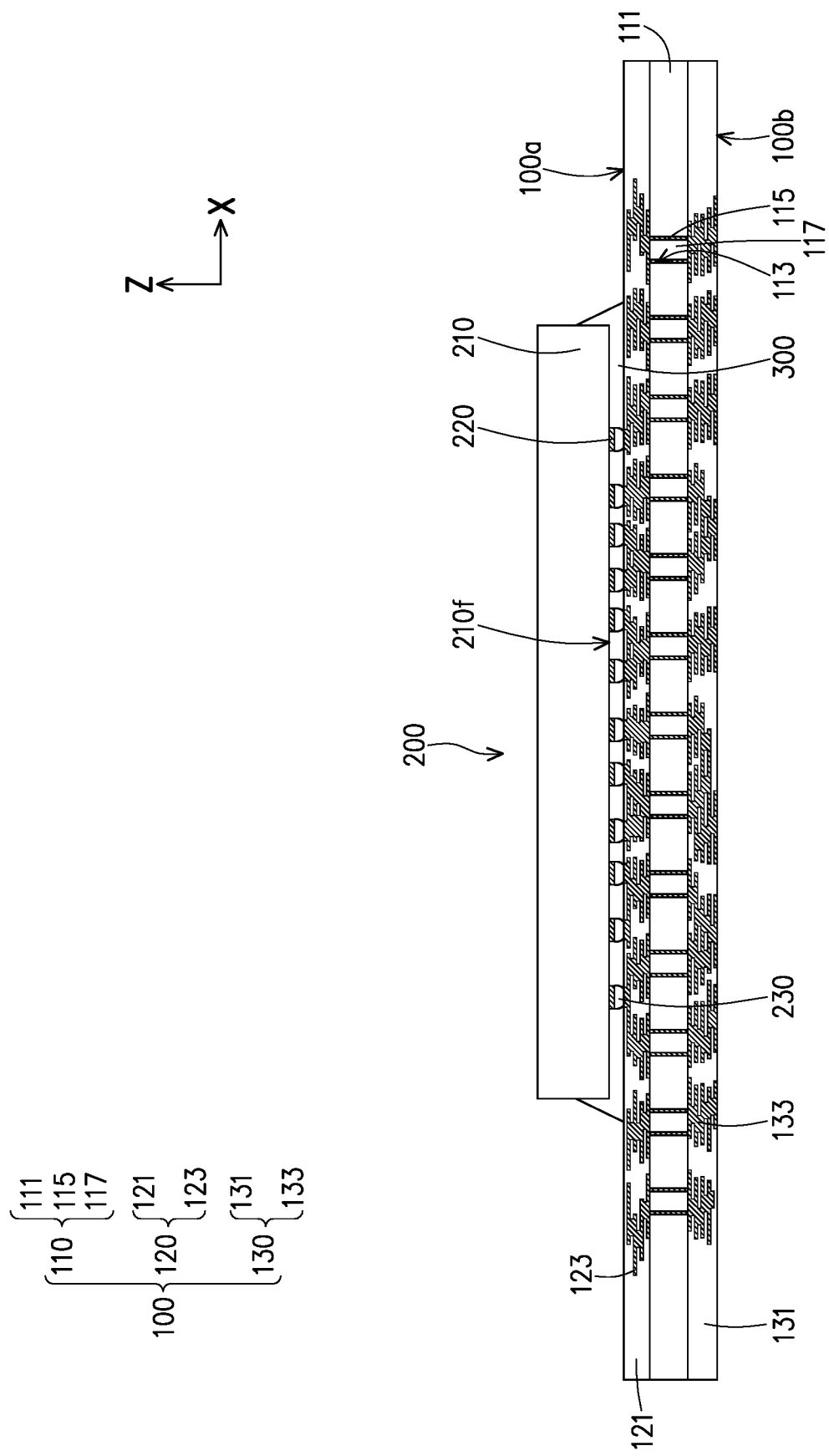

In FIG. 1B, a semiconductor package 200 is connected to an exposed side 100a of the circuit substrate 100 (e.g., the side of the build-up layer 120). In some embodiments, the semiconductor package 200 includes a chip 210 having conductive pads 220 exposed at the front surface 210f of the chip 210. In some embodiments, the front surface 210f of the chip 210 may be considered as the front surface of the semiconductor package 200. In some embodiments, the chip 210 may be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, the chip 210 may be a memory die.

In some embodiments, conductive terminals 230 are formed on the conductive pads 220 of the semiconductor package 200 to connect the semiconductor package 200 to the circuit substrate 100. For example, the semiconductor package 200 may be disposed on the circuit substrate 100 with the conductive terminals 230 landing on exposed conductive patterns 123 of the build-up layer 120. In some embodiments, the conductive terminals 230 are C4-bumps, and the semiconductor package 200 is flip-chip bonded to the circuit substrate 100. In some embodiments, an underfill 300 is disposed between the semiconductor package 200 and the circuit substrate 100 to protect the conductive terminals 230 from thermal and mechanical stresses. The underfill may include a resin, such as an epoxy resin or the like, and may be formed, for example, by vacuum underfill or other suitable processes.

Figure 1C:
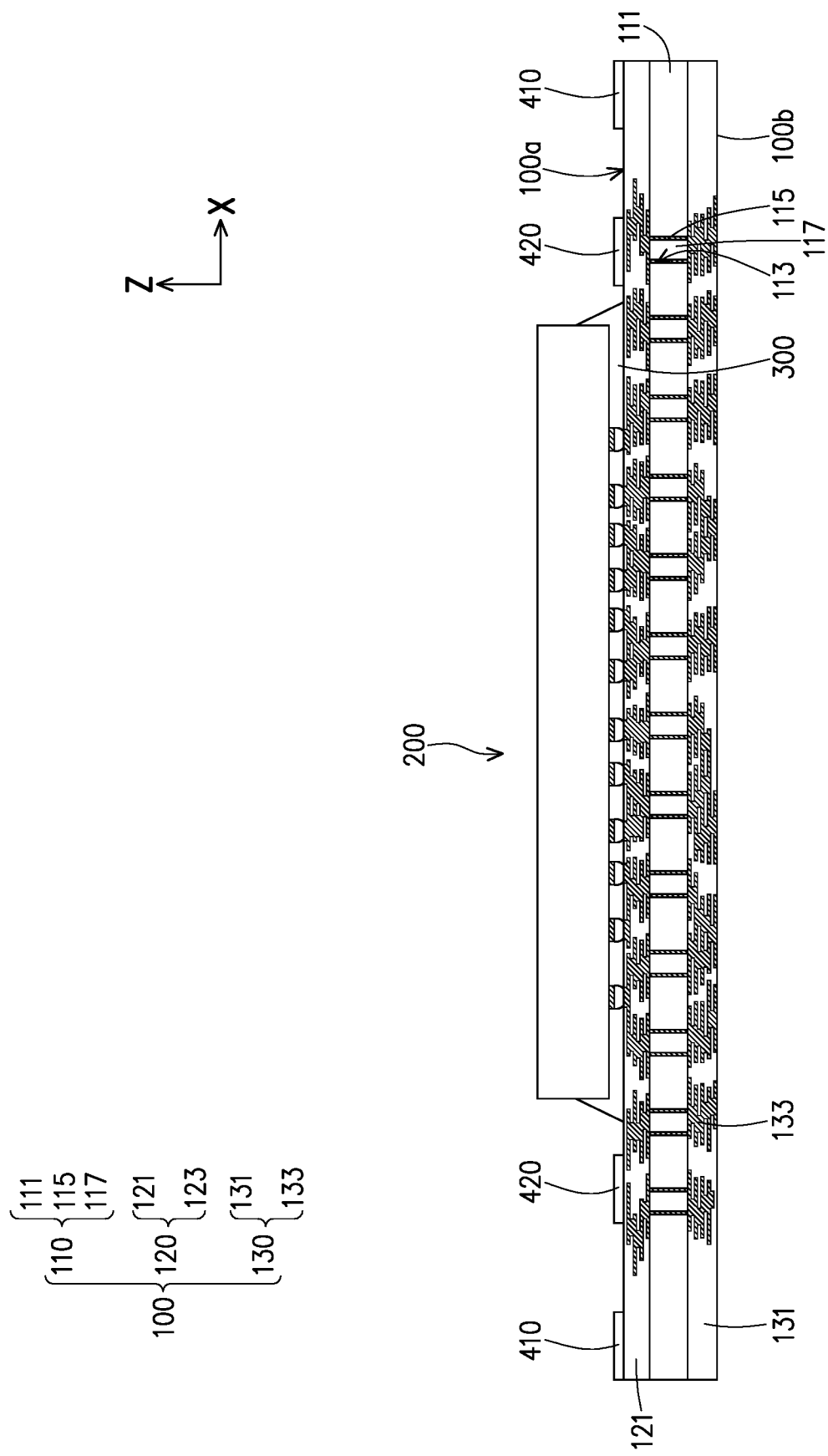

Referring to FIG. 1C, in some embodiments, adhesives 410, 420 are disposed on the side 100a of the circuit substrate 100, beside the semiconductor package 200. In some embodiments, the adhesives 410 and 420 form concentric frames surrounding the semiconductor package 200, with the adhesive 420 forming an inner frame closer to the semiconductor package 200 and the adhesive 410 forming an outer frame further away from the semiconductor package 200 with respect to the adhesive 410. In some embodiments, the adhesive 410 may be disposed in proximity of the outer periphery of the circuit substrate 100. In some embodiments, the adhesives 410, 420 are disposed following the profile of the semiconductor package 200 and/or the profile of the outer periphery of the circuit substrate 100. For example, if the circuit substrate 100 has a rectangular footprint, the adhesives 410, 420 may have the shape of concentric rectangular frames. Similarly, if the circuit substrate 100 has a circular footprint, the adhesives 410, 420 may have the shape of concentric circular frames. In some embodiments, the multiple portions of adhesives 410, 420 are disposed on the circuit substrate 100 to form the frames. That is, the frames formed by the adhesives 410, 420 may be discontinuous, presenting gaps in which the circuit substrate 100 is exposed in between consecutive portions of adhesive 410 or 420. In some embodiments, the adhesives 410, 420 include a thermocurable adhesive, a photocurable adhesive, a thermally conductive adhesive, a thermosetting resin, a waterproof adhesive, a lamination adhesive, or a combination thereof. In some embodiments, the adhesives 410, 412 include a metallic layer (not shown) with solder paste (not shown) deposited thereon. According to the type of material used, the adhesives 410, 420 may be formed by deposition, lamination, printing, plating, or any other suitable technique.

Figure 1D:
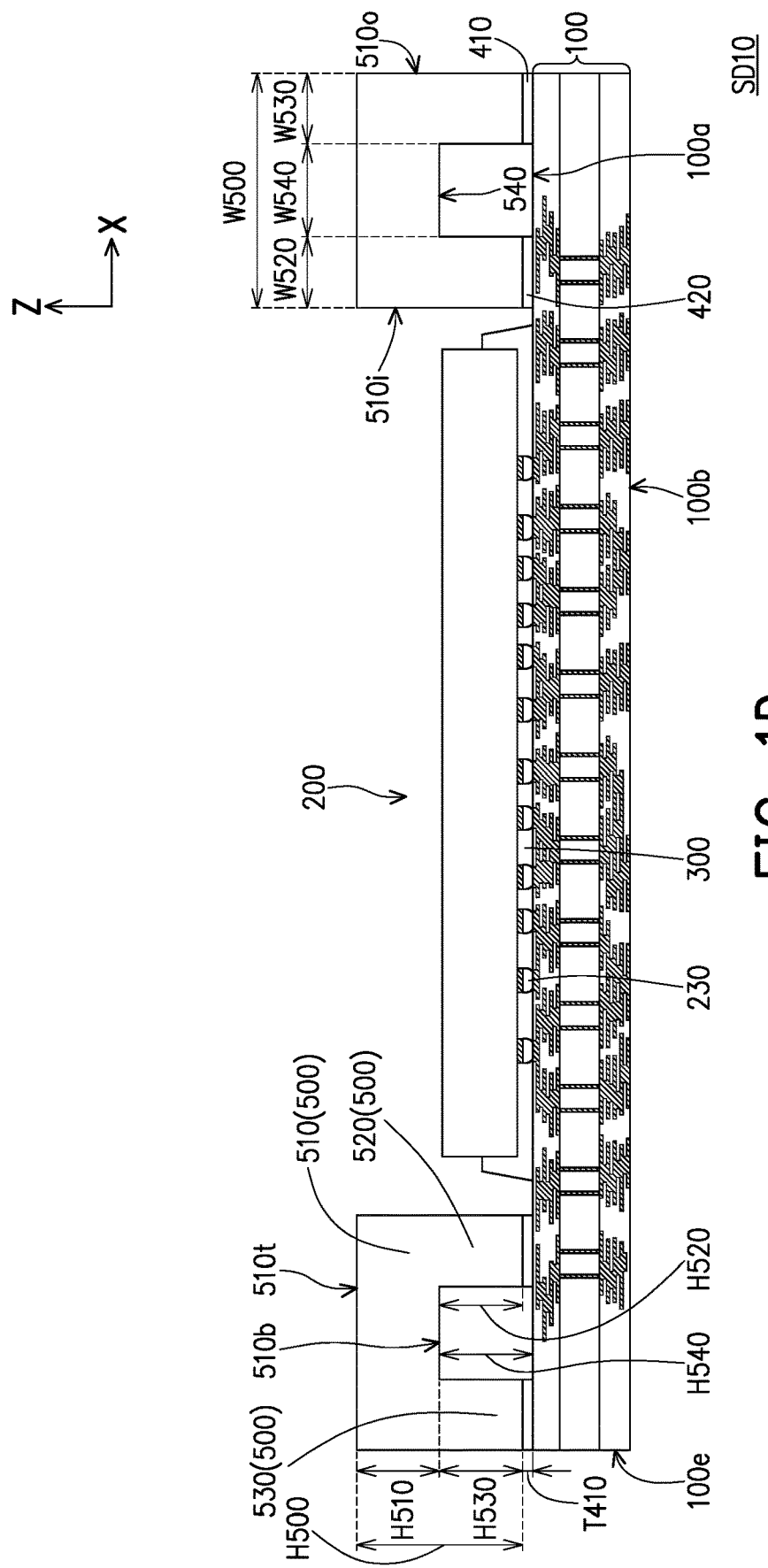
Figures 2A, 2B:
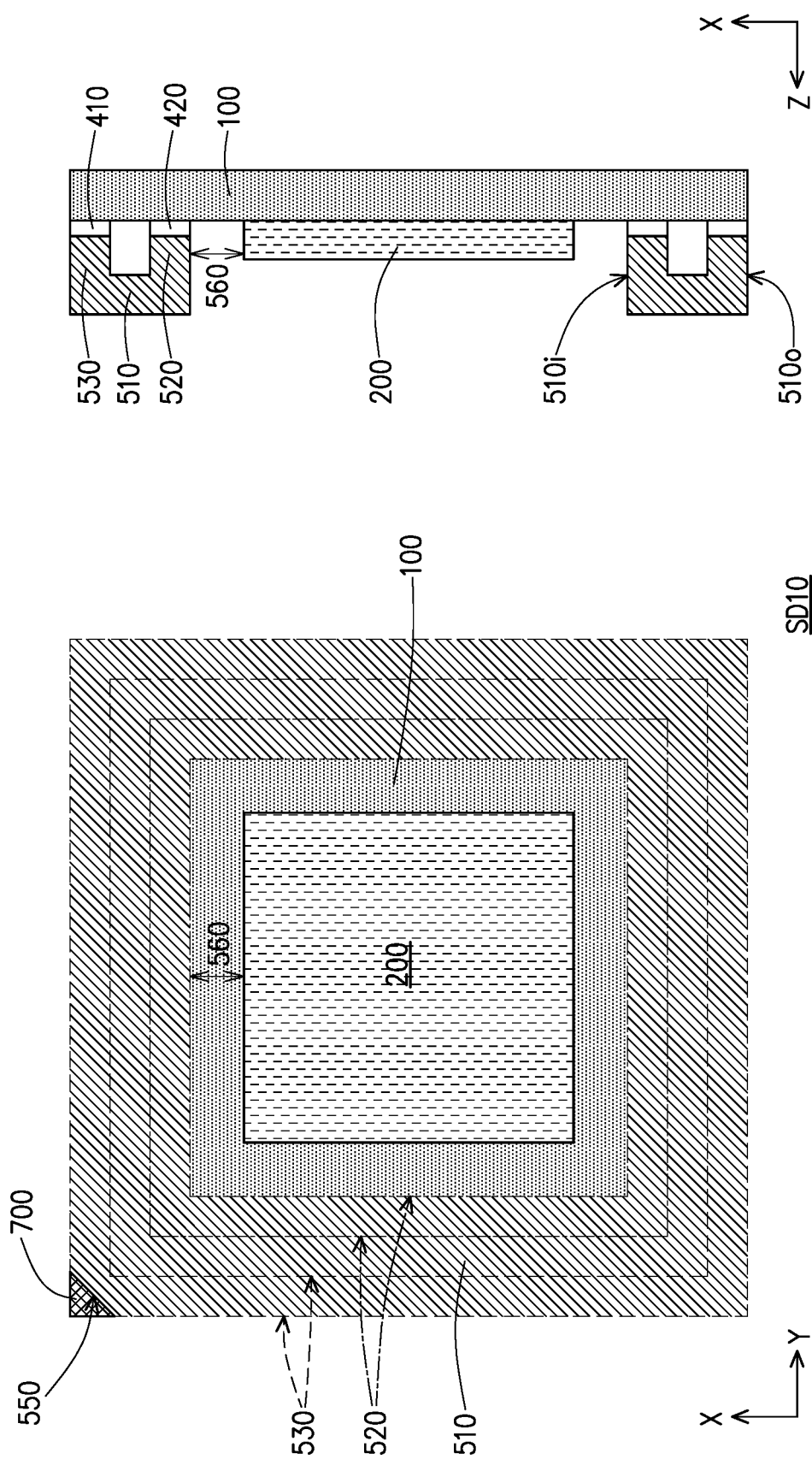
FIG. 2A is a schematic top view of a semiconductor device according to some embodiments of the disclosure.
FIG. 2B is a schematic side view of the semiconductor device of FIG. 2A according to some embodiments of the disclosure.

FIG. 1D is a cross-sectional view of the semiconductor device SD10 according to some embodiments of the disclosure. FIG. 2A is a schematic top view of the semiconductor device SD10 according to some embodiments of the disclosure. FIG. 2B is a schematic side view of the semiconductor device SD10, aligned with respect to the top view of FIG. 2A and with some elements illustrated in a simplified manner or even omitted with respect to FIG. 1D. In some embodiments, manufacturing the semiconductor device SD10 includes disposing a package frame 500 on the circuit substrate 100, for example on the structure illustrated in FIG. 1C. In some embodiments, the package frame 500 may include a thermally conductive material. For example, the package frame 500 may include a metal, a metallic alloy, a semiconductor material or the like, such as stainless steel, silicon carbide alloy, machinable ceramic, dummy silicon, kovar, invar, molybdenum, copper- or nickel-clad molybdenum, copper-clad Invar, copper tungsten, aluminum, diamond composites, metal diamond alloys, silver diamond or a combination thereof. In some embodiments, the package frame 500 may include a metallic material such as copper, and may be subjected to an anodization or passivation treatment (e.g., with nickel) to enhance its environmental resistance before being installed on the circuit substrate 100. In some embodiments, the package frame 500 includes a roof 510, inner flanges 520, and outer flanges 530. The inner flanges 520 are disposed at the inner edge 510i of the roof 510, protruding from the roof 510 towards the circuit substrate 100, for example in correspondence of the inner adhesive 420. In FIG. 2A, the footprint of the inner flanges 520 is illustrated by dash-dotted lines. The outer flanges 530 are disposed at an outer edge 510o of the roof 510 opposite to the inner edge 510i, protruding from the roof 510 towards the circuit substrate 100, for example in correspondence of the outer adhesive 410. In FIG. 2A, the footprint of the outer flanges 530 is illustrated by dashed lines. In some embodiments, the inner flanges 520 land on the circuit substrate 100 in correspondence of the adhesive 420, and the outer flanges 530 land on the circuit substrate 100 in correspondence of the adhesive 410. The inner flanges 520 and the outer flanges 530 may both have an annular shape, substantially following the shape of one or both of the semiconductor package 200 or the circuit substrate 100. In some embodiments, the footprint of the package frame 500 substantially matches with the footprint of the circuit substrate 100. The outer flanges 530 may land in proximity of the outer edge 100e of the circuit substrate 100. The outer edge 100e of the circuit substrate 100 is the peripheral surface joining the side 100a of the circuit substrate 100 with the opposite side 100b.

The roof 510 is supported in two points over the circuit substrate 100, for example by the inner flanges 520 and the outer flanges 530, and extends from the inner flanges 520 to the outer flanges 530. In some embodiments, the roof 510, the inner flanges 520, and the outer flanges 530 enclose an annular cavity 540 on the side 100a of the circuit substrate 100. That is, while the inner flanges 520 and the outer flanges 530 contact the adhesives 410, 420, the bottom surface 510b of the roof 510 is at a height H540 from the circuit substrate 100. The height H540 may be considered the vertical distance (e.g., along the Z direction) from the top surface (the outer surface at the side 100a) of the circuit substrate 100 to the bottom surface 510b of the roof 510. In some embodiments, the height H540 may be in the range from 0.2 to 1 mm, for example about 0.5 mm. In some embodiments, the height H530 of the outer flanges 530 (which may be equal to the height H520 of the inner flanges 520) may be considered the distance from the level height of the bottom of the outer flanges 530 to the level height of the bottom surface 510b of the roof 510, and may be different from the height H540 of the cavity 540 by the thickness T410 of the adhesive 410 (which may be substantially equal to the thickness of the adhesive 420). In some embodiments, the height H510 of the roof 510 may be considered the (vertical) distance from the level height of the bottom surface 510b of the roof 510 to the level height of the top surface 510t of the roof 510. In some embodiments, the height H510 may be in the range from about 0.5 mm to about 1.5 mm. In some embodiments, the distance from the level height of the bottom of the inner flanges 520 or the outer flanges 530 to the level height of the top surface 510t of the roof 510 may be considered a height H500 of the package frame 500. In some embodiments, the height H500 may be in the range from about 1 mm to 2.5 mm, for example about 2 mm. In some embodiments, a (horizontal) width W500 of the package frame 500 measured in a (horizontal) direction substantially perpendicular to the edges of the package frame 500 may be about in the range from 20 mm to 30 mm, for example from 22 mm to 26 mm, such as about 25 mm. In some embodiments, the width W500 in the X direction may be different from the width W500 in the Y direction. In some embodiments, each one of the widths W520, W530 of the inner flanges 520 and the outer flanges 530 may be about a quarter of the width W500, and the width W540 may be about half of the width W500. For example, each one of the widths W520, W530 may independently be about in the range from 4 mm to 12 mm, such as about 6 mm, and the width W540 of the cavity 540 may be about in the range from 10 to 16 mm, such as about 13 mm.

In some embodiments, the roof 510, the inner flanges 520 and the outer flanges 530 of the package frame 500 are integrally formed (formed as a single piece), for example by punching a sheet (not illustrated) of the material of the package frame 500. In some embodiments, the package frame 500 is placed over the circuit substrate 100. In some embodiments, before bonding the package frame 500, the package frame 500 is vertically aligned with the circuit substrate 100. For example, a corner 550 of the package frame 500 may be chamfered or cut, and may be used for alignment of the package frame 500 together with an alignment mark 700 formed on the circuit substrate 100. For example, the alignment mark 700 may have a complementary shape with respect to the cut corner 550 of the package frame 500. After the package frame 500 is placed on the circuit substrate 100, the adhesives 410 and 420 may be cured to secure attachment of the package frame 500 to the circuit substrate 100. Curing conditions may vary according to the adhesive material used. For example, a curing temperature may be in the range from 150 to 170° C., and a curing time may be from about 30 minutes to 1 hour or longer. In some embodiments, even after the package frame 500 is secured to the circuit substrate 100, the semiconductor package 200 remains exposed. A gap 560 may separate the inner flanges 520 of the package frame 500 from the semiconductor package 200. In some embodiments, the gap 560 may be about in the range from 2 mm to 6 mm, such as 3 mm, for example.

In some embodiments, heating process such as curing of the adhesive may result in warpage of the circuit substrate 100. In some embodiments, by including a package frame 500 having two contact points (e.g., the inner flanges 520 and the outer flanges 530) and including a roof 510 not contacting the circuit substrate 100, the warpage of the circuit substrate 100 may be significantly reduced, while avoiding or reducing delamination between the adhesives 410, 420 and the package frame 500. For example, compared with the case in which the entire frame contacts the circuit substrate 100 through an adhesive material, the controlled thickness of the inner flanges 520 and the outer flanges 530 may result in fewer voids detected in adhesives 410, 420 securing the package frame 500, while the warpage of the circuit substrate 100 may be almost halved. In some embodiments, reduced warpage of the semiconductor device SD10 also translates in less stress accumulated at the junction between the semiconductor package 200 and the circuit substrate 100, for example in correspondence of the conductive terminals 230 or the underfill 300. In some embodiments, cracking of the underfill may be effectively reduced or prevented. Furthermore, the annular shape of the package frame 500 may leave exposed the semiconductor package 200. When heat exchangers (not illustrated) are applied to the semiconductor device SD10, such heat exchangers may be in closer contact to the semiconductor package 200 compared to the case in which lids fully covering the semiconductor package 200 are applied. Therefore, inclusion of the package frame 500 may result in superior thermal performance of the semiconductor device SD10.

Figure 1E:
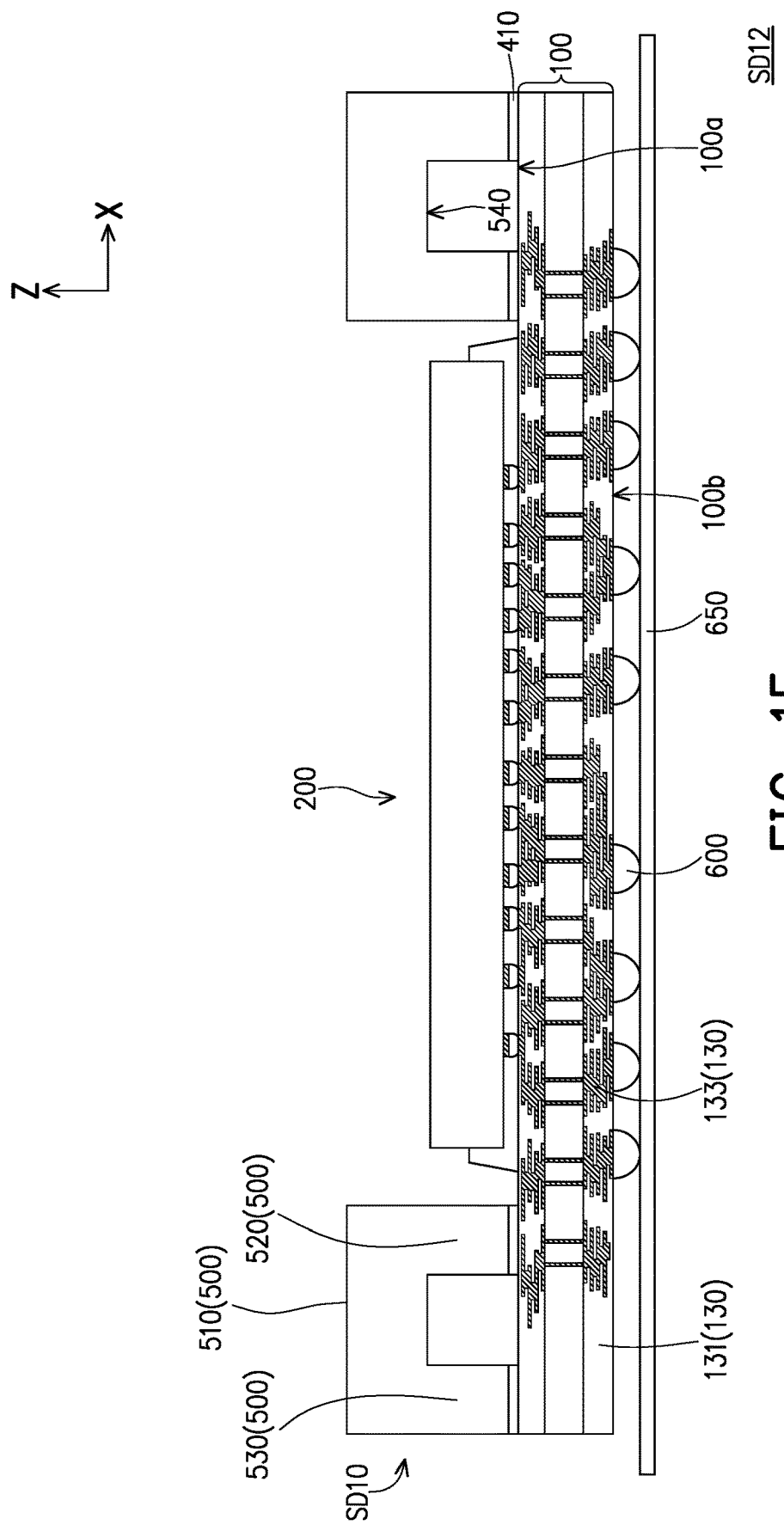
FIG. 1E is a schematic cross-sectional view of a semiconductor device according to some embodiments of the present disclosure.

In FIG. 1E is illustrated the semiconductor device SD10 integrated in a larger semiconductor device SD12, according to some embodiments of the disclosure. For example, connective terminals 600 may be installed on the side 100b of the circuit substrate 100 opposite to the side 100a to which the semiconductor package 200 is bonded. In some embodiments, the connective terminals 600 are solder balls for ball grid array mounts. In some embodiments, the connective terminals 600 are electrically connected to the semiconductor package 200 via the circuit substrate 100. In some embodiments, the connective terminals 600 may be used to integrate the semiconductor device SD10 with other components, for example to connect to a circuit board 650. It should be noted that while in the following disclosure the semiconductor devices may be presented without including connective terminals or being integrated in larger devices, the disclosure also includes embodiments in which these additional components are included and integration in larger devices is contemplated for all of the semiconductor devices presented herein. Similarly, if a semiconductor device is illustrated including additional components such as the connective terminals, the disclosure also includes embodiments in which the additional components are not included. Unless otherwise specified, the description of structures, materials and processes given above for the components of the semiconductor device SD10 applies to corresponding components of the other semiconductor devices of the disclosure.

Figure 3A:
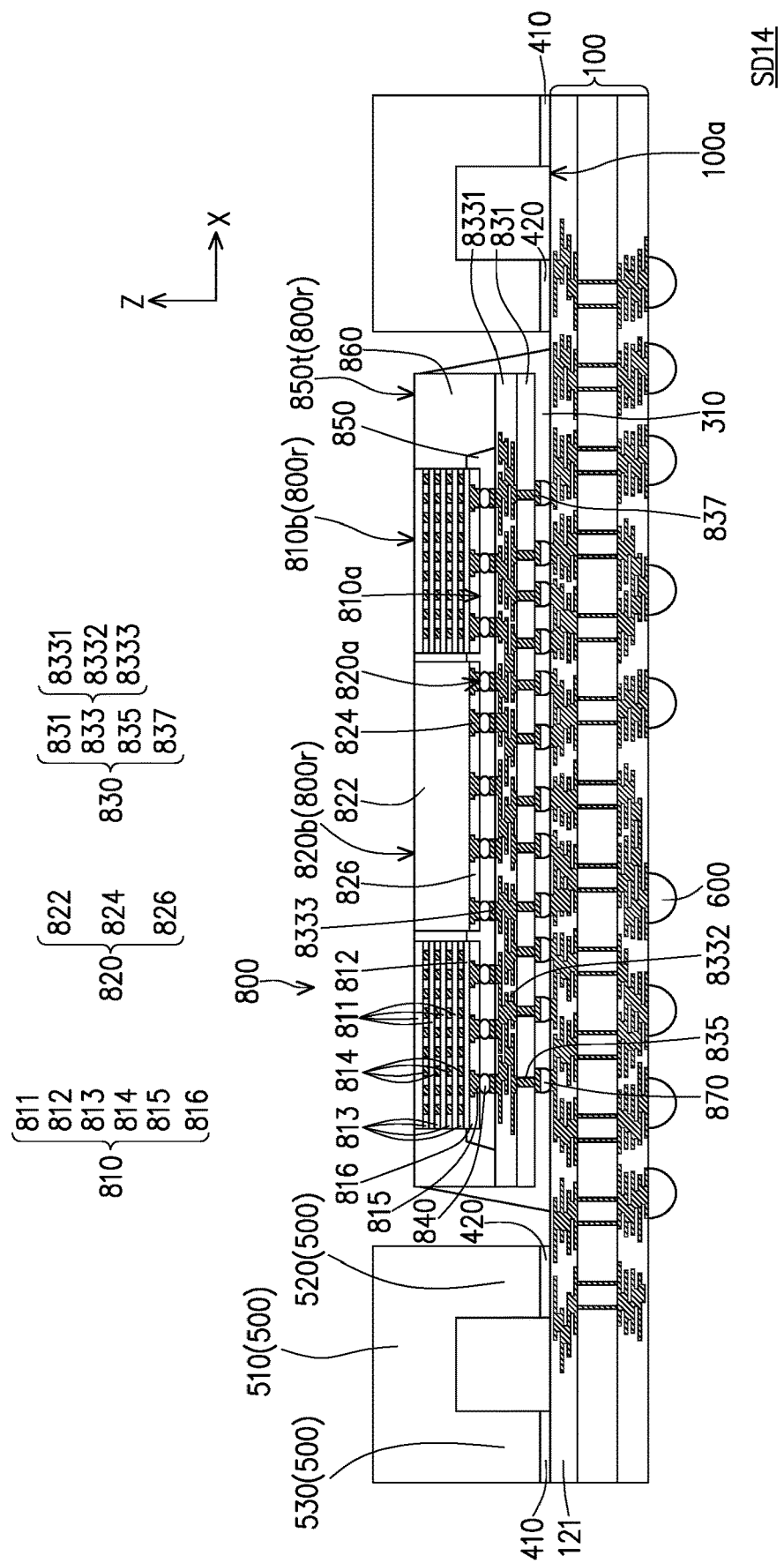
FIG. 3A to FIG. 3C are schematic cross-sectional views of semiconductor devices according to some embodiments of the disclosure.

In FIG. 3A is illustrated a cross-sectional view of a semiconductor device SD14 according to some embodiments of the disclosure. The semiconductor device SD14 of FIG. 3A may be similar to the semiconductor device SD10 of FIG. 1D, and the description of corresponding elements and manufacturing processes equally applies. In some embodiments, the semiconductor device SD14 includes a Chip-on-Wafer package as the semiconductor package 800 bonded to the circuit substrate 100 and encircled by the package frame 500. In some embodiments, the semiconductor package 800 includes one or more chips 810, 820. In some embodiments, the chips 810, 820 may have different structures and perform different functions. For example, one or more of the chips 810 may be memory chips (e.g., high-bandwidth memories), while one or more of the chips 820 may be or include a logic die, such as a central processing unit (CPU) die, a graphic processing unit (GPU)

die, a micro control unit (MCU) die, an input-output (I/O) die, a baseband (BB) die, or an application processor (AP) die. For example, a chip 810 may include semiconductor dies 811 stacked over a base die 812. The semiconductor dies 811 may be separated from each other by portions of insulating material 813, and be vertically interconnected, for example, through micro-bumps 814. Contact pads 815 encircled by a protective layer 816 may be formed at the active surface of the chip 810, at an opposite side of the base die 812 with respect to the semiconductor dies 811. In some embodiments, a chip 820 may include a semiconductor substrate 822, contact pads 824 and a passivation layer 826. The contact pads 824 may be formed on a front surface of the semiconductor substrate 822. The passivation layer 826 may cover the front surface of the semiconductor substrate 822 and have a plurality of openings that exposes at least a portion of each contact pad 824. As a way of example, in FIG. 3A the semiconductor package 800 is illustrated as including a chip 820 and two chips 810 disposed at the sides of the chip 820. However, the disclosure is not limited by the type, number, or structure of the chips 810, 820 included in the semiconductor package 800.

In some embodiments, the chips 810, 820 are bonded to an interposer 830. In some embodiments, the interposer 830 includes a semiconductor substrate 831, an interconnection structure 833, through semiconductor vias (TSVs) 835, and contact pads 837. In some embodiments, the interposer 830 includes a semiconductor (e.g., silicon) wafer as the semiconductor substrate 831. In some embodiments, the interconnection structure 833 is disposed on the semiconductor substrate 831 and includes a dielectric layer 8331, conductive patterns 8332, and under-bump metallurgies 8333. For simplicity, the dielectric layer 8331 is illustrated as a single dielectric layer and the conductive patterns 8332 are illustrated as embedded in the dielectric layer 8331. In some embodiments, the TSVs 835 are formed in the semiconductor substrate 831, and provide dual-side electrical connection through the semiconductor substrate 831, interconnecting the conductive patterns 8332 to the contact pads 837.

In some embodiments, the chips 810, 820 are bonded via connectors 840 to the interposer 830. In some embodiments, the connectors 840 are micro-bumps installed on the contact pads 815, 824 and sandwiched between the contact pads 815, 824 and the under-bump metallurgies 8333 or the TSVs 835 (if no interconnection structure 833 is included in the interposer 830). According to some embodiments, the chips 810, 820 are disposed with the backside surfaces 810*b*, 820*b* facing away from the interposer 830.

In some embodiments, an underfill 850 may be disposed between the chips 810, 820 and the interposer 830 to protect the connectors 840 against thermal or physical stress and secure the electrical connection of the chips 810, 820 to the interposer 830. In some embodiments, the underfill 850 is formed by capillary underfill filling (CUF). In some embodiments, as shown in FIG. 3A, a single common underfill 850 may extend below the chips 810, 820 depending on the spacing and relative positions of the chips over the interposer 830. In some alternative embodiments, multiple underfill portions (not shown) are formed, each portion securing the connectors 840 of a chip 810, 820. In some embodiments, an encapsulant 860 is formed over the interposer 830 wrapping the chips 810, 820 and the underfills 850. In some embodiments, the encapsulant 860 may include a molding compound, a molding underfill, a resin (such as an epoxy resin), or the like. In some embodiments, the encapsulant 860 is formed by an over-molding process.

In some embodiments, conductive terminals 870 are disposed between the contact pads 837 of the semiconductor package 800 and the portions of the conductive patterns 123 of the build-up layer 120 exposed by the (outermost) dielectric layer 121. In some embodiments, the conductive terminals 870 are C4-bumps. In some embodiments, an underfill 310 is disposed between the semiconductor package 800 and the circuit substrate 100 to protect the conductive terminals 310 from thermal and mechanical stresses.

Figure 3B:
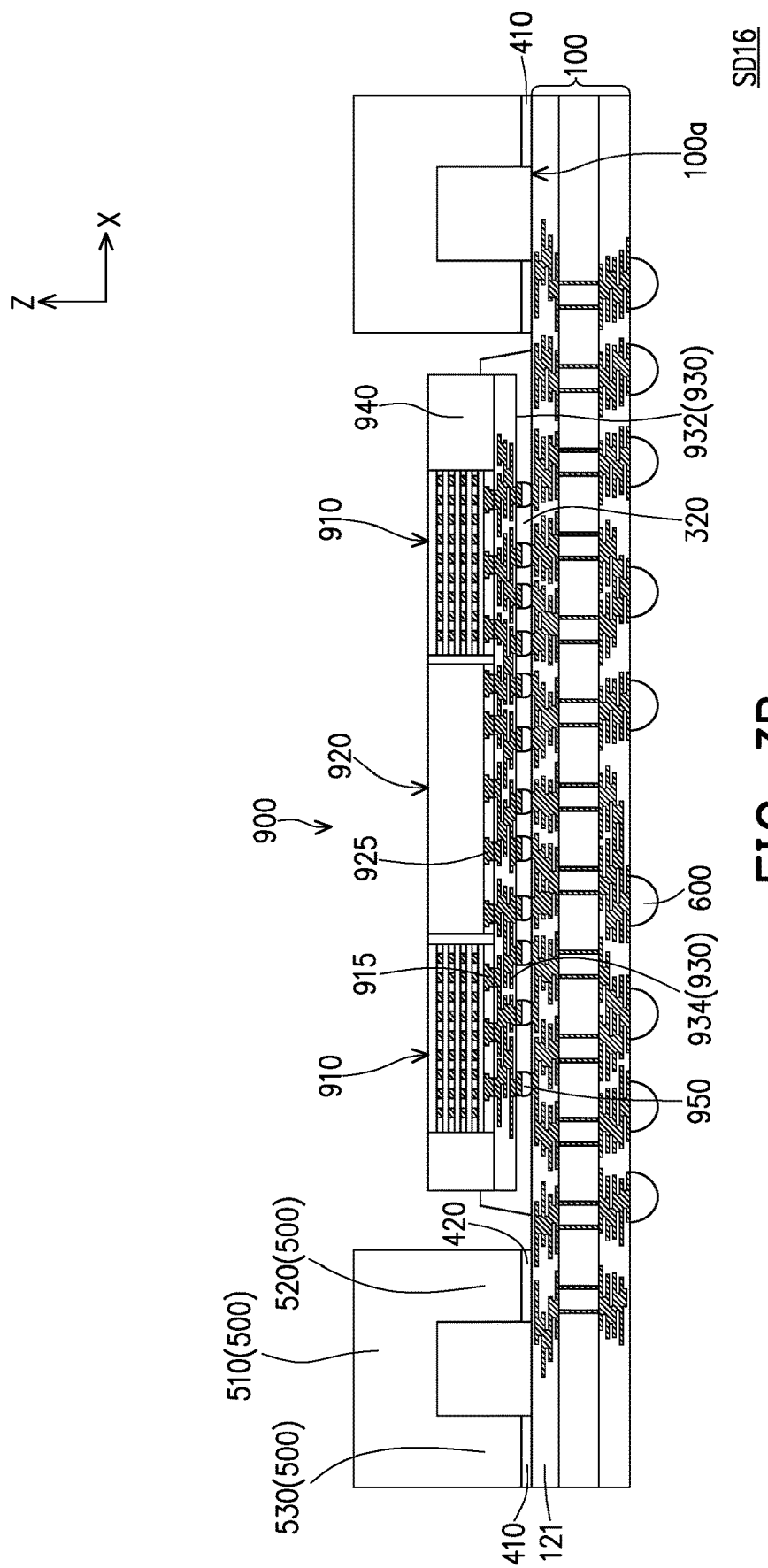

In FIG. 3B is illustrated a cross-sectional view of a semiconductor device SD16 according to some embodiments of the disclosure. The semiconductor device SD16 of FIG. 3B may be similar to the semiconductor device SD14 of FIG. 3A, and the description of corresponding elements and manufacturing processes equally applies. In some embodiments, the semiconductor device SD16 includes an InFO package as the semiconductor package 900 bonded to the circuit substrate 100 and encircled by the package frame 500. In some embodiments, the semiconductor package 900 includes one or more chips 910, 920, which may have same or similar structures as the chips 810, 820 previously described with reference to FIG. 3A. In some embodiments, the chips 910, 920 are directly connected to a redistribution structure 930. That is, the contact pads 915, 925 of the chips 910, 920 may be in direct contact with redistribution conductive traces 934 of the redistribution structure 930. The redistribution conductive traces 934 may be sandwiched between dielectric layers 932. In some embodiments, the chips 910, 920 are encapsulated in an encapsulant 940, and the redistribution structure 930 extends on the chips 910, 920 and the encapsulant 940. Conductive terminals 950 disposed on an opposite side of the redistribution structure 930 with respect to the chips 910, 920 connects the redistribution structure 930 to the circuit substrate 100. In some embodiments, the conductive terminals 950 are C4-bumps. In some embodiments, an underfill 320 is disposed between the semiconductor package 900 and the circuit substrate 100 to protect the conductive terminals 950 from thermal and mechanical stresses.

It will be apparent that while the semiconductor devices SD10 of FIG. 1D, SD12 of FIG. 1E, SD14 of FIG. 3A, and SD16 of FIG. 3B have been illustrated with certain structures of the corresponding semiconductor packages 200, 800, or 900, the disclosure does not limit the structure of the semiconductor packages included in the semiconductor devices. Furthermore, while in the following the semiconductor devices will be illustrated as including the semiconductor package 200, embodiments including different semiconductor packages are also contemplated within the scope of the disclosure.

Figure 3C:
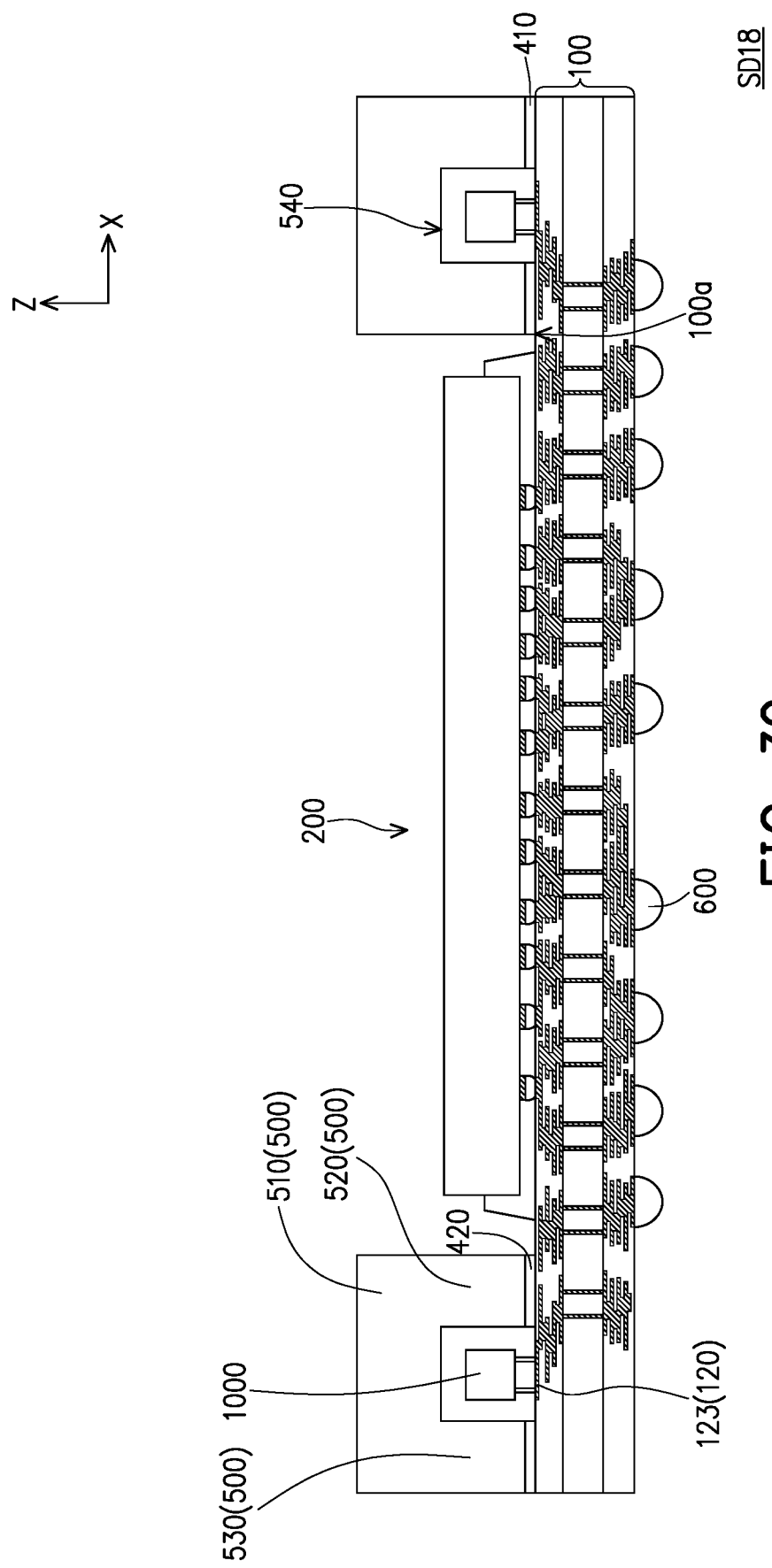

In FIG. 3C is illustrated a cross-sectional view of a semiconductor device SD18 according to some embodiments of the disclosure. The semiconductor device SD18 of FIG. 3C may be similar to the semiconductor device SD10 of FIG. 1D, and the description of corresponding elements and manufacturing processes equally applies. In some embodiments, the semiconductor device SD18 further includes surface mount devices 1000 connected to the circuit substrate 100 within the annular cavity 540 of the package frame 500. In some embodiments, the surface mount devices 1000 are chips of integrated passive devices and function as capacitors, inductors, resistors, or the like. In some embodiments, each surface mount device 1000 may independently function as a capacitor having different capacitance values, resonance frequencies, and/or different sizes, an inductor, or the like. In some embodiments, the surface mount devices 1000 are disposed with the front surfaces directed towards the circuit substrate 100, so as to be connected with conductive patterns 123 of the circuit substrate 100. In some embodiments, the surface mount devices 1000 are placed over the circuit substrate 100 through a pick-and-place method, and are connected to the circuit substrate 100 before installing the package frame 500. For example, the surface mount devices 1000 may be connected to the circuit substrate 100 after the semiconductor package 200 is connected, before or after the adhesives 410, 420 are disposed on the circuit substrate 100. The adhesives 410, 420 and the package frame 500 may be disposed on the circuit substrate 100 as previously described, aligned so that the surface mount device 1000 are located within the cavity 540. In some embodiments, by disposing the surface mount devices 1000 within the cavity 540 of the package frame 500 (e.g., covered by the roof 510), size penalty which may be caused by the width of the package frame 500 may be reduced without compromising the possibility of further functionalization of the semiconductor device SD18. That is, by including a package frame 500 forming a cavity 540 around the semiconductor package 200, the warpage may be effectively controlled, for example by increasing the width of the package frame 500 without incurring in an area penalty because of the increased width of the package frame 500.

Figure 4B:
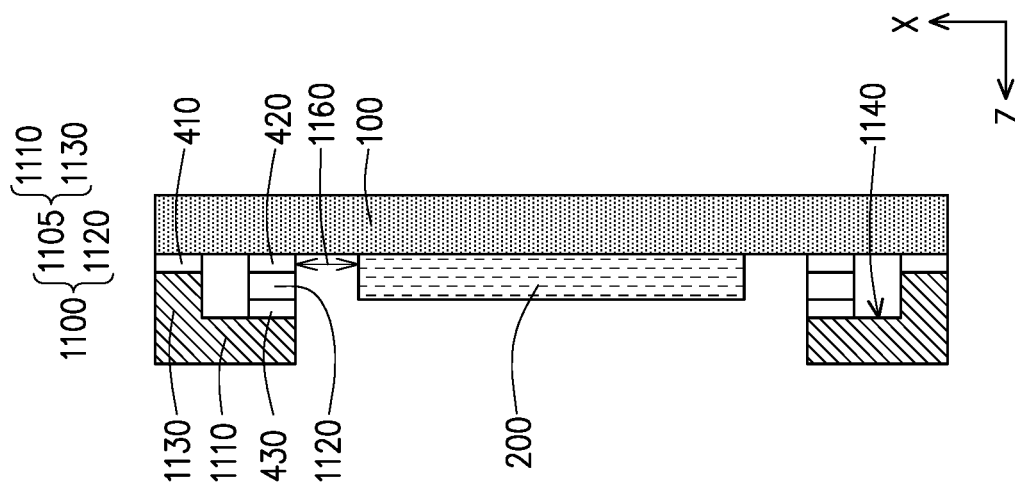
Figure 4A:
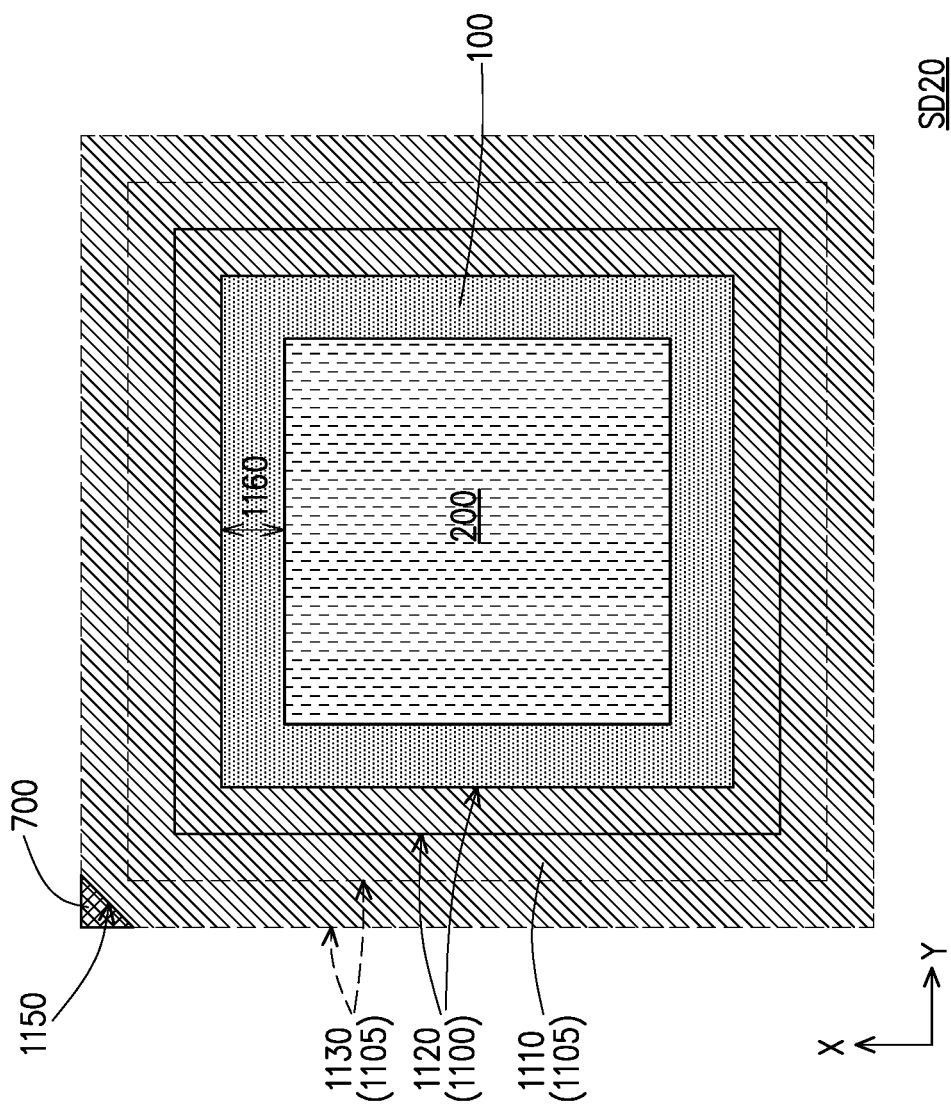

FIG. 4A is a schematic top view of a semiconductor device SD20 according to some embodiments of the disclosure. FIG. 4B is a schematic side view of the semiconductor device SD20, aligned with respect to the top view of FIG. 4A and with some elements illustrated in a simplified manner or even omitted. The semiconductor device SD20 may have a similar structure and be fabricated following a similar process as previously described for the semiconductor device SD10 of FIG. 1D. In some embodiments, the semiconductor device SD20 includes the package frame 1100 in which a roof portion 1105 including the roof 1110 and the outer flanges 1130 is formed as a separate piece from the inner flanges 1120. In the roof portion 1105, the roof 1110 and the outer flanges 1130 are integrally formed. For example, the inner flanges 1120 may be a frame bonded by the adhesive 420 encircling the semiconductor package 200, disposed at a gap 1160 from the semiconductor package 200. An additional portion of adhesive 430 is disposed on the inner flanges 1120, and the side of the inner edge of the roof 1110 is secured by the adhesive 430 to the inner flanges 1120. That is, the package frame 1100 may still contact the circuit substrate 100 in two concentric areas corresponding to the inner flanges 1120 and the outer flanges 1130, with the roof 1110 extending from the outer flanges 1130 to the inner flanges 1120 and resting on the inner flanges 1120 via the adhesive 430. Therefore, also in the semiconductor package SD20, the package frame 1100 describes a closed annular cavity 1140 encircling the semiconductor package 200. In FIG. 4A the footprint of the inner flanges 1120 is indicated by solid lines, and the footprint of the outer flanges 1130 is indicated by dashed lines. The package frame 1100 may be assembled on the circuit substrate 100 piece-wise. For example, after the adhesive 420 is disposed on the circuit substrate 100, the inner flanges 1120 may be disposed on the adhesive 420. The adhesive 430 may be disposed on the inner flanges 1120, and the roof portion 1105 may be disposed on the circuit substrate 100 contacting the adhesives 410 and 430. In some embodiments, a corner 1150 of the roof portion 1105 may be cut to allow for alignment of the package frame 1100 with alignment marks 700 formed on the circuit substrate 100.

In some embodiments, the material of the roof portion 1105 and the inner flanges 1120 may be selected as a function of the expected warpage of the semiconductor device SD20. For example, if the coefficient of thermal expansion of the semiconductor package 200 is sufficiently similar to the coefficient of thermal expansion of the circuit substrate 100, little warpage (and, hence, stress at the level of the semiconductor package 200, the conductive terminals or the underfill) is expected to be observed. In such case, the inner flanges 1120 and the roof portion 1105 may include a same material, simplifying the manufacturing process and costs. In some alternative embodiments, the mismatch between the coefficient of thermal expansion may be rather large, and significant warpage of the semiconductor device SD20 may be expected. In such cases, the inner flanges 1120 may include a material having a relatively lower coefficient of thermal expansion than the material of the roof portion 1105. For example, the inner flanges 1120 may include stainless steel, and the roof portion may include copper or a different kind of stainless steel having an higher coefficient of thermal expansion. By including the package frame 1100, the warpage experienced by the semiconductor device SD20 may be reduced. In some embodiments, the package frame 1100 may be particularly effective in reducing the crying-type warpage, in which the periphery of the circuit substrate 100 bends towards the negative Z direction and the central region where the semiconductor package 200 is located bends towards the positive Z direction.

Figure 5B:
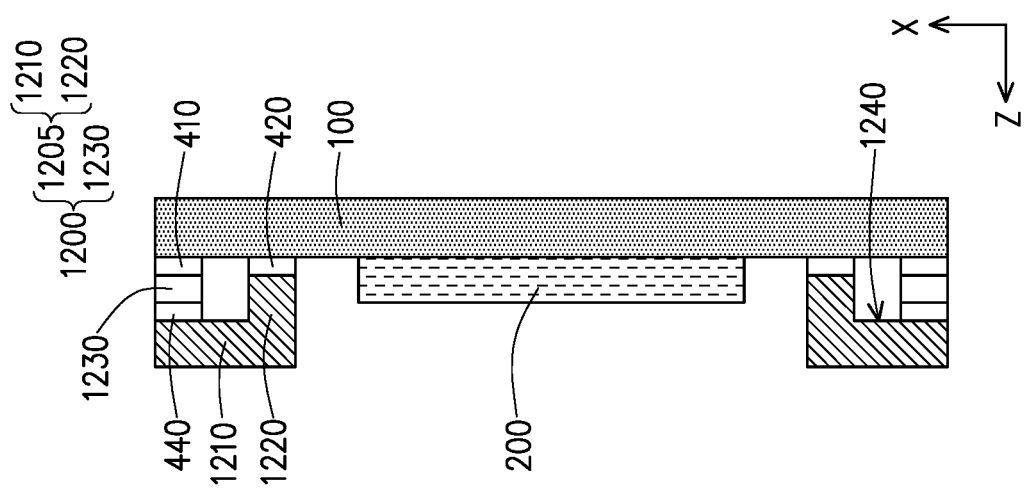
Figure 5A:
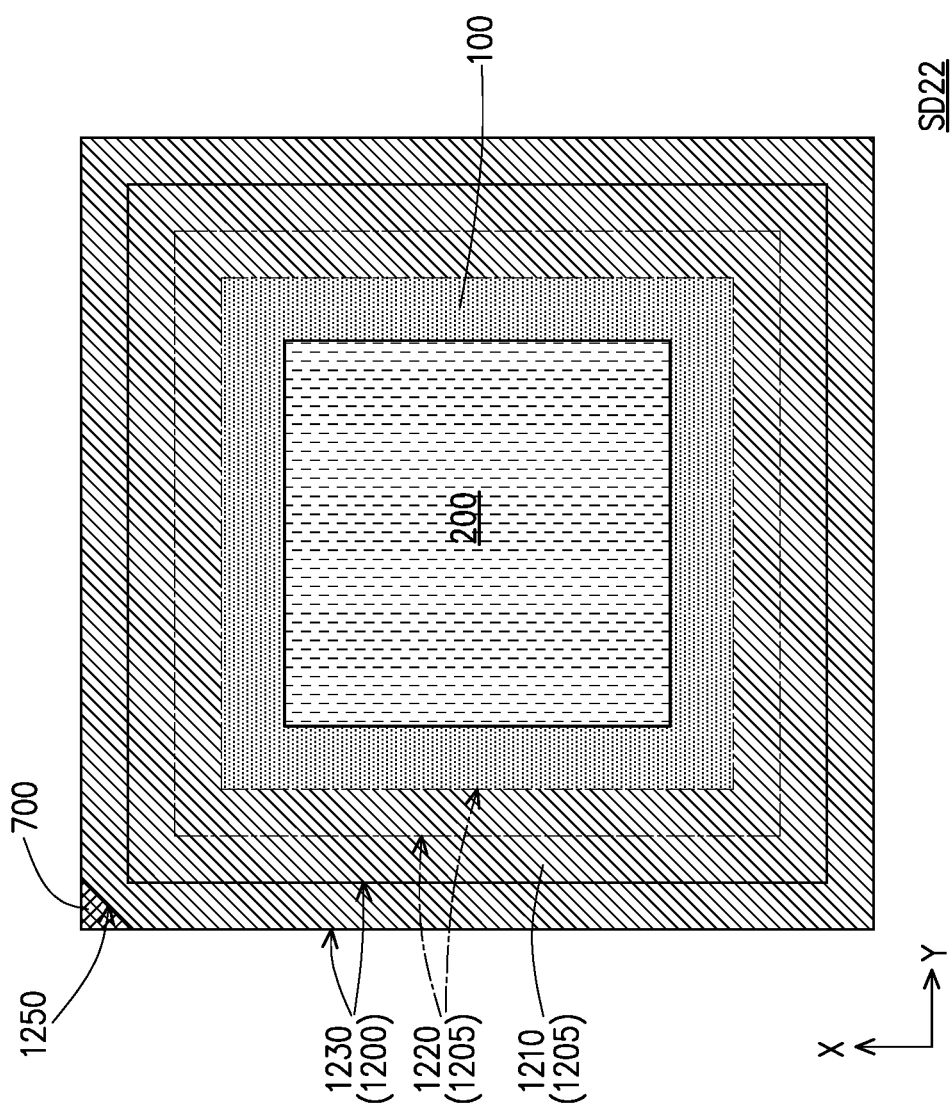

FIG. 5A is a schematic top view of a semiconductor device SD22 according to some embodiments of the disclosure. FIG. 5B is a schematic side view of the semiconductor device SD22, aligned with respect to the top view of FIG. 5A and with some elements illustrated in a simplified manner or even omitted. The semiconductor device SD22 may have a similar structure and be fabricated following a similar process as previously described for the semiconductor device SD20 of FIG. 4A. In some embodiments, the semiconductor device SD22 includes the package frame 1200 in which a roof portion 1205 including the roof 1210 and the inner flanges 1120 is formed as a separate piece from the outer flanges 1230. In the roof portion 1205, the roof 1210 and the inner flanges 1220 are integrally formed. For example, the outer flanges 1230 may be a frame disposed on the adhesive 410 encircling the semiconductor package 200 and the inner flanges 1220. An additional portion of adhesive 440 is disposed on the outer flanges 1230, and the side of the outer edge of the roof 1210 is secured by the adhesive 440 to the outer flanges 1230. That is, the package frame 1200 may still contact the circuit substrate 100 in two concentric areas corresponding to the inner flanges 1220 and the outer flanges 1230, with the roof 1210 extending from the inner flanges 1220 to the outer flanges 1230 and resting on the outer flanges 1230 via the adhesive 440. Therefore, also in the semiconductor package SD22, the package frame 1200 describes a closed annular cavity 1240 encircling the semiconductor package 200. In FIG. 5A the footprint of the inner flanges 1220 is indicated by dash-dotted lines, and the footprint of the outer flanges 1230 is indicated by solid lines. The package frame 1200 may be assembled on the circuit substrate 100 piece-wise. For example, after the adhesive 410 is disposed on the circuit substrate 100, the outer flanges 1230 may be disposed on the adhesive 410. The adhesive 440 may be disposed on the outer flanges 1230, and the roof portion 1205 may be disposed on the circuit substrate 100 contacting the adhesives 420 and 440. In some embodiments, a corner 1250 of the roof portion 1205 may be cut to allow for alignment of the package frame 1200 with alignment marks 700 formed on the circuit substrate 100.

In some embodiments, the material of the roof portion 1205 and the outer flanges 1230 may be selected as a function of the expected warpage of the semiconductor device SD22, similar to what was previously described for the semiconductor device SD20 of FIG. 4A. By including the package frame 1200, the warpage experienced by the semiconductor device SD22 may be reduced. In some embodiments, the package frame 1200 may be particularly effective in reducing the smiling-type warpage, in which the periphery of the circuit substrate 100 bends towards the positive Z direction and the region where the semiconductor package 200 is located bends towards the negative Z direction.

Figure 6B:
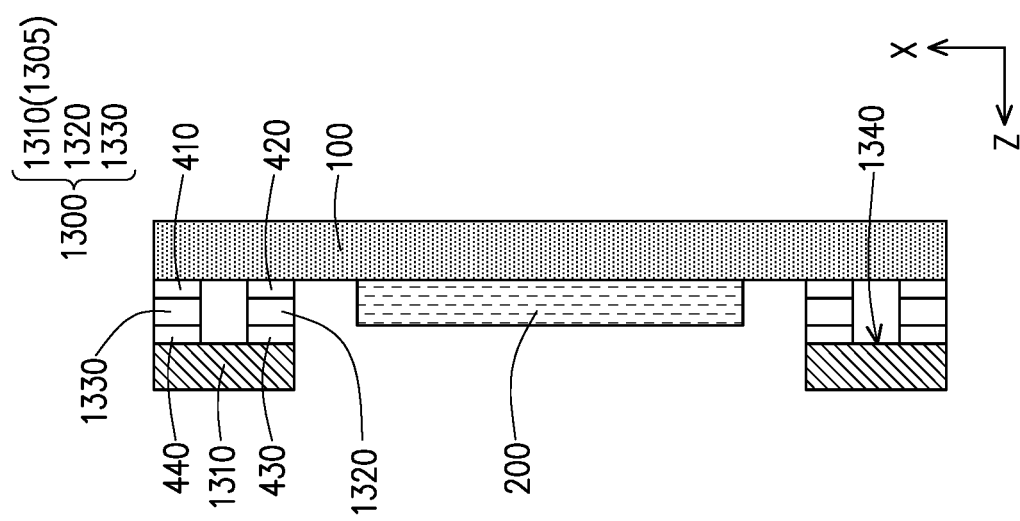
Figure 6A:
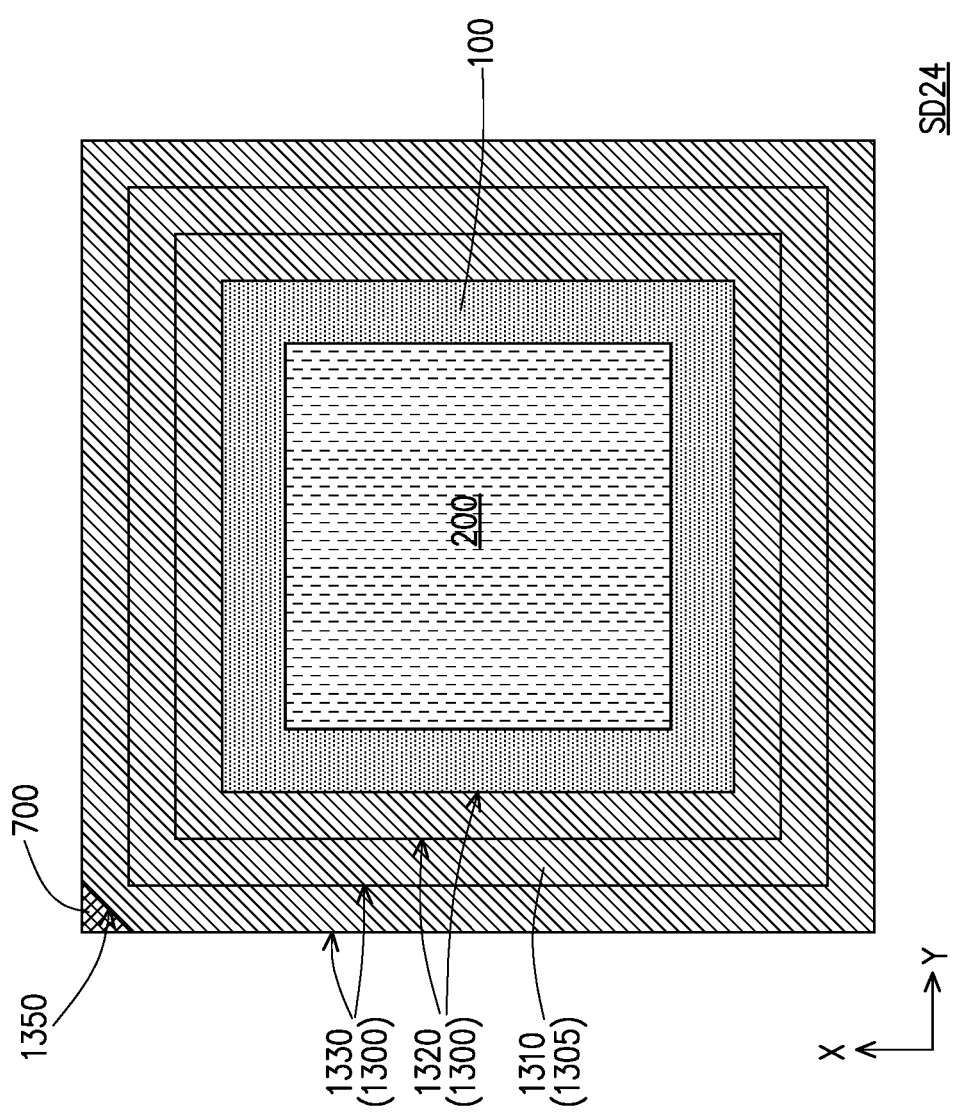

FIG. 6A is a schematic top view of a semiconductor device SD24 according to some embodiments of the disclosure. FIG. 6B is a schematic side view of the semiconductor device SD24, aligned with respect to the top view of FIG. 6A and with some elements illustrated in a simplified manner or even omitted. The semiconductor device SD24 may have a similar structure and be fabricated following a similar process as previously described for the semiconductor device SD20 of FIG. 4A. In some embodiments, the semiconductor device SD24 includes the package frame 1300 in which a roof portion 1305 including the roof 1310 is formed as a separate piece from both of the inner flanges 1320 and the outer flanges 1330. For example, the inner flanges 1320 may be a frame disposed on the adhesive 420 encircling the semiconductor package 200, and the outer flanges 1330 may be another frame disposed on the adhesive 410 encircling the semiconductor package 200 and the inner flanges 1320. Additional portions of adhesive 430 and 440 are respectively disposed on the inner flanges 1320 and the outer flanges 1330, so that the side of the inner edge of the roof 1310 is secured by the adhesive 430 to the inner flanges 1320 and the side of the outer edge of the roof 1310 is secured by the adhesive 440 to the outer flanges 1330. That is, the package frame 1300 may still contact the circuit substrate 100 in two concentric areas corresponding to the inner flanges 1320 and the outer flanges 1330, with the roof 1310 extending from the inner flanges 1320 to the outer flanges 1330 and resting on the inner flanges 1320 via the adhesive 320 and on the outer flanges 1330 via the adhesive 440. Therefore, also in the semiconductor package SD24, the package frame 1300 describes a closed annular cavity 1340 encircling the semiconductor package 200. In FIG. 6A the footprints of the inner flanges 1320 and the outer flanges 1330 are indicated by solid lines. The package frame 1300 may be assembled on the circuit substrate 100 piece-wise. For example, after the adhesive 410 is disposed on the circuit substrate 100, the outer flanges 1330 may be disposed on the adhesive 410, and after the adhesive 420 is disposed on the circuit substrate 100, the inner flanges 1320 are disposed on the adhesive 420. The adhesives 430 and 440 may be respectively disposed on the inner flanges 1220 and on the outer flanges 1230, and the roof portion 1305 may be disposed on the circuit substrate 100 contacting the adhesives 430 and 440. In some embodiments, a corner 1350 of the roof portion 1305 may be cut to allow for alignment of the package frame 1300 with alignment marks 700 formed on the circuit substrate 100. In some embodiments, by forming the roof 1310, the inner flanges 1320, and the outer flanges 1330 of the package frame 1300 as separate pieces, greater flexibility in the choice of the materials for the individual parts may be achieved, with the materials being selected, for example, to further reduce the warpage experienced by the semiconductor device SD24, similarly to what was previously described for the semiconductor device SD20 with reference to FIG. 4A.

FIG. 7A is a schematic top view of a semiconductor device SD26 according to some embodiments of the disclosure. FIG. 7B is a schematic side view of the semiconductor device SD26, aligned with respect to the top view of FIG. 7A and with some elements illustrated in a simplified manner or even omitted. The semiconductor device SD26 may have a similar structure and be fabricated following a similar process as previously described for the semiconductor device SD20 of FIG. 4A. In some embodiments, the semiconductor device SD26 includes the package frame 1400 in which a roof portion 1405 including the roof 1110 and the outer flanges 1130 is formed as a separate piece from the inner flanges 1120. In the roof portion 1405, the roof 1410 and the outer flanges 1430 are integrally formed. For example, the inner flanges 1420 may be a frame bonded by the adhesive 420 encircling the semiconductor package 200, disposed at a gap 1460 from the semiconductor package 200. The roof portion 1405 may be another frame encircling the inner flanges 1420, disposed on the adhesive 410. That is, the package frame 1400 may still contact the circuit substrate 100 in two concentric areas corresponding to the inner flanges 1420 and the outer flanges 1430. The roof 1410 extends from the outer flanges 1430 towards the inner flanges 1420. However, differently than in the other devices previously described, the roof 1410 does not contact the inner flanges 1420. Rather, the roof portion 1405 is disposed on the circuit substrate separated by the gap 1470 from the inner flanges 1420. The gap 1470 may be considered the distance from the outer sidewall of the inner flanges 1420 to the inner edge of the roof 1410. In some embodiments, the height H1420 of the inner flanges 1420 along the Z direction is substantially equal to the height H1405 of the roof portion 1405 (e.g., the combined height of the outer flanges 1430 and the roof 1410). That is, the inner flanges 1420 may be taller than the outer flanges 1430. In some embodiments, the package frame 1400 describes an open annular cavity 1440 encircling the semiconductor package 200. In FIG. 7A the footprint of the inner flanges 1420 is indicated by solid lines, and the footprint of the outer flanges 1430 is indicated by dashed lines. The package frame 1400 may be assembled on the circuit substrate 100 piece-wise. For example, after the adhesives 410 and 420 are disposed on the circuit substrate 100, the inner flanges 1420 may be disposed on the adhesive 420 and the roof portion 1405 may be disposed on the adhesive 410. In some embodiments, a corner 1450 of the roof portion 1405 may be cut to allow for alignment of the package frame 1400 with alignment marks 700 formed on the circuit substrate 100. In some embodiments, the material of the roof portion 1405 and the inner flanges 1420 may be selected as a function of the expected warpage of the semiconductor device SD26, similar to what was previously described for the semiconductor device SD20 of FIG. 4A. For example, the inner flanges 1420 may include stainless steel, and the roof portion 1405 may include copper. In some embodiments, by including the package frame 1400, the warpage experienced by the semiconductor device SD26 may be reduced. More particularly, in some embodiments the inclusion of the inner flanges 1420 may reduce cracking at the level of the underfill between the semiconductor package 200 and the circuit substrate 100 (e.g., the underfill 300 of FIG. 1B), and the inclusion of the roof portion 1405 may help to control warpage of the semiconductor device SD26.

FIG. 8A is a schematic top view of a semiconductor device SD28 according to some embodiments of the disclosure. FIG. 8B is a schematic side view of the semiconductor device SD28, aligned with respect to the top view of FIG. 8A and with some elements illustrated in a simplified manner or even omitted. The semiconductor device SD28 may have a similar structure and be fabricated following a similar process as previously described for the semiconductor device SD10 of FIG. 1D. In some embodiments, the semiconductor device SD28 includes the package frame 1500 in which a roof portion 1505 including the roof 1510 and the outer flanges 1530 is disposed encircling the semiconductor package 200, with the side of the inner edge 1510i of the roof 1510 resting on thermal interface material 450 disposed on the rear surface 200r of the semiconductor package 200. The vertical projection of the inner edge 1510i may entirely fall on the rear surface 200r of the semiconductor package 200. In the roof portion 1505, the roof 1510 and the outer flanges 1530 are integrally formed. In some embodiments, the thermal interface material 450 is disposed on the rear surface 200r of the semiconductor package 200, along the outer edge 200e of the semiconductor package 200, to secure the roof 1510 to the semiconductor package 200. That is, the package frame 1500 may still contact the circuit substrate 100 in two concentric areas corresponding to the outer flanges 1530 and the peripheral area of the rear surface 200r of the semiconductor package 200 along the outer edge 200e of the semiconductor package 200, with the roof 1510 extending from the outer flanges 1530 to the semiconductor package 200 and resting on the semiconductor package 200 via the thermal interface material 450. Therefore, also in the semiconductor package SD28, the package frame 1500 describes a closed annular cavity 1540 encircling the semiconductor package 200. In the semiconductor package SD28, the cavity 1540 may be defined by the package frame 1500, the semiconductor package 200, and the circuit substrate 100. In FIG. 8A the footprint of the outer flanges 1530 is indicated by dashed lines, and the area where the thermal interface material 450 is dispensed is indicated as a dotted area. In some embodiments, the area where the thermal interface material 450 is dispensed may coincide with the area of overlap (and contact) between the semiconductor package 200 and the roof 1510. That is, the roof 1510 may leave exposed most of the rear surface 200r of the semiconductor package 200, for example corresponding to a central area of the rear surface 200r. For example, up to about 90% of the rear surface 200r may be left exposed by the roof 1510. In some embodiments, the roof 1510 may be designed so as to leave exposed expected hot spots formed in the semiconductor package 200 during use, so as to ensure efficient thermal dissipation.

In some embodiments, the package frame 1500 may be disposed on the circuit substrate 100 after the adhesive 410 is disposed on the circuit substrate 100 and the thermal interface material 450 is disposed on the semiconductor package 200. In some embodiments, the thermal interface material 450 includes a grease-based material, a phase change material, a gel, an adhesive, a polymeric material, a metallic material, a liquid metal thermal compound, or a combination thereof. In some embodiments, the thermal interface material 450 includes lead-tin based solder (PbSn), silver paste (Ag), gold, tin, gallium, indium, rhodium, zinc or other suitable thermally conductive materials. According to the type of material used, the thermal interface material 450 may be formed by deposition, lamination, printing, plating, or any other suitable technique. In some embodiments, the thermal interface material 450 is a gel type material. In some embodiments, the thermal interface material 450 may be a film type material. For example, the thermal interface material 450 may be a sheet of conductive material (e.g., carbon nanotubes, graphene, or graphite) or a composite film with conductive materials such as fillers (e.g., powders, flake shape particles, nanotubes, fibers, etc.) embedded in a base material. The roof portion 1505 may be disposed on the circuit substrate 100 with the outer flanges 1530 contacting the adhesive 410, and the side of the inner edge 1510i of the roof 1510 contacting the thermal interface material 450. In some embodiments, a corner 1550 of the roof portion 1505 may be cut to allow for alignment of the package frame 1500 with alignment marks 700 formed on the circuit substrate 100.

In some embodiments, by including a package frame 1500 having two contact points (e.g., the outer flanges 1530 and the roof 1510 resting on the semiconductor package 200) while leaving exposed most of the rear surface 200r, the warpage of the circuit substrate 100 may be significantly reduced without significantly affecting thermal performance of the semiconductor device SD28. For example, the heat dissipation performance of a semiconductor device SD28 including a package frame such as the package frame 1500 may be within about 5% of the heat dissipation performance of a semiconductor device including a ring not covering the rear surface 200r of the semiconductor package 200. In some embodiments, the package frame 1500 is attached by the adhesive 410 only in correspondence of the outer flanges 1530, allowing for proper dispensing and curing of the adhesive 410 with fewer if any voids formed in the adhesive 410. At the same time, because the roof 1510 extends from the outer flanges 1530 to the semiconductor package 200, the warpage of the semiconductor device SD28 may be effectively controlled. In addition, the package frame 1500 may be easy to assemble as including the roof portion 1505 formed as a single piece.

Figure 9B:
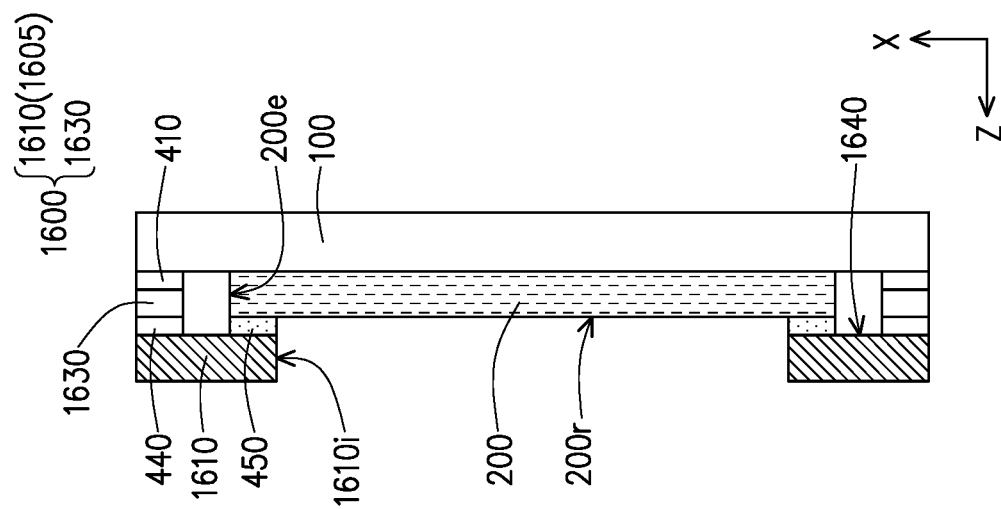
Figure 9A:
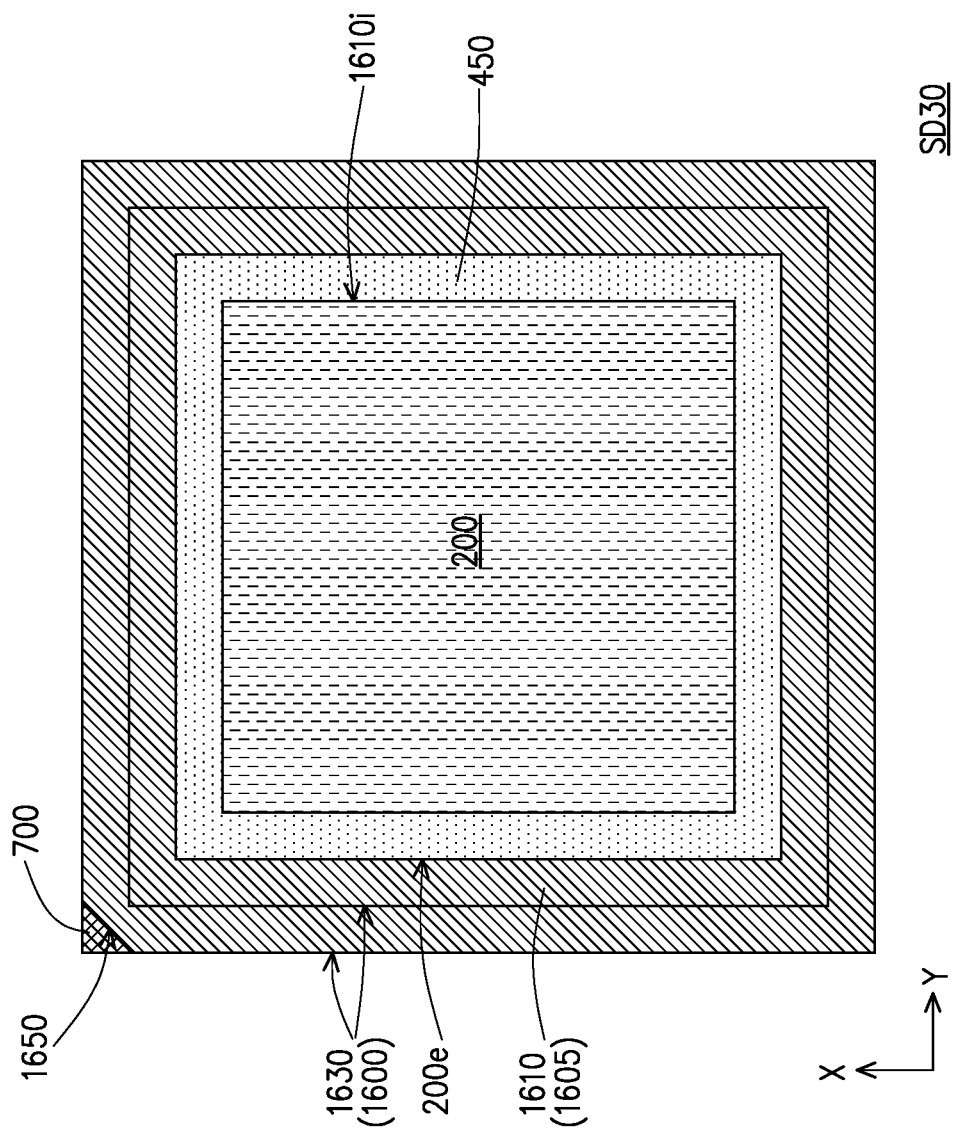

FIG. 9A is a schematic top view of a semiconductor device SD30 according to some embodiments of the disclosure. FIG. 9B is a schematic side view of the semiconductor device SD30, aligned with respect to the top view of FIG. 9A and with some elements illustrated in a simplified manner or even omitted. The semiconductor device SD30 may have a similar structure and be fabricated following a similar process as previously described for the semiconductor device SD28 of FIG. 8A. In some embodiments, the semiconductor device SD30 includes the package frame 1600 in which the roof portion 1605 including the roof 1610 is formed as a separate piece from the outer flanges 1630. For example, the outer flanges 1630 may be a frame disposed on the adhesive 410 encircling the semiconductor package 200. An additional portion of adhesive 440 is disposed on the outer flanges 1630, and the side of the outer edge of the roof 1610 is secured by the adhesive 440 to the outer flanges 1630. The roof 1610 may extend from the outer flanges 1630 to the semiconductor package 200, with the side of the inner edge 1610i of the roof 1610 resting on the thermal interface material 450 disposed on the semiconductor package 200, as previously described for the semiconductor device SD28 of FIG. 8A. The inner edge 1610i is opposite to the outer edge. That is, the package frame 1600 may still contact the circuit substrate 100 in two concentric areas corresponding to the outer flanges 1630 and the peripheral area of the rear surface 200r of the semiconductor package 200 along the outer edge 200e of the semiconductor package 200, with the roof 1610 extending from the outer flanges 1630 to the semiconductor package 200 and resting on the semiconductor package 200 via the thermal interface material 450. Therefore, also in the semiconductor package SD28, the package frame 1600 describes a closed annular cavity 1640 encircling the semiconductor package 200. In FIG. 9A the footprint of the outer flanges 1230 is indicated by solid lines, and the area where the thermal interface material 450 is dispensed is indicated as a dotted area. The package frame 1600 may be assembled on the circuit substrate 100 piece-wise. For example, after the adhesive 410 is disposed on the circuit substrate 100, the outer flanges 1630 may be disposed on the adhesive 410. The adhesive 440 may be disposed on the outer flanges 1630, and the thermal interface material 450 may be disposed on the semiconductor package 200. The roof portion 1605 may then be disposed on the circuit substrate 100 contacting the adhesive 410 and the thermal interface material 450. In some embodiments, a corner 1650 of the roof portion 1605 may be cut to allow for alignment of the package frame 1600 with alignment marks 700 formed on the circuit substrate 100. In some embodiments, the material of the roof portion 1605 and the outer flanges 1630 may be selected as a function of the expected warpage of the semiconductor device SD30, similar to what was previously described for the semiconductor device SD20 of FIG. 4A. By including the package frame 1600, the warpage experienced by the semiconductor device SD30 may be reduced.

Figure 10A:
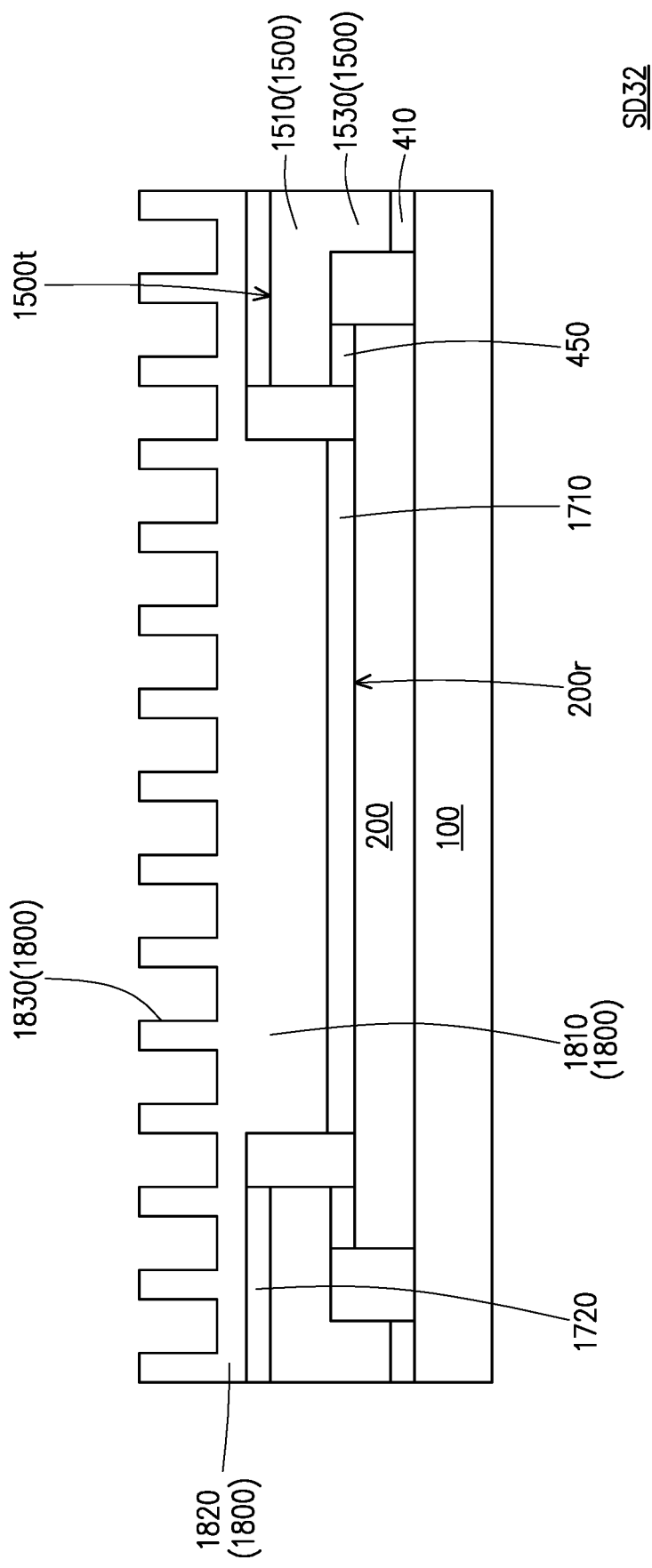
FIG. 10A to FIG. 10C are schematic cross-sectional views of semiconductor devices according to some embodiments of the disclosure.

FIG. 10A is a schematic side view of a semiconductor device SD32 according to some embodiments of the disclosure, with some elements illustrated in a simplified manner or even omitted. The semiconductor device SD32 may have a similar structure and be fabricated following a similar process as previously described for the semiconductor device SD28 of FIG. 8A. In some embodiments, the semiconductor device SD32 may be obtained from the semiconductor device SD28 by further adding additional thermal interface material 1710 on the exposed rear surface 200r of the semiconductor package 200, additional thermal interface material 1720 on the top surface 1500t of the package frame 1500, and by disposing a heat exchanger 1800 on the semiconductor package 200 and the package frame 1500, secured via the additional thermal interface material 1710, 1720. In some embodiments, each of the additional thermal interface materials 1710, 1720 may be independently selected from the options mentioned above for the thermal interface material 450. In some embodiments, the thermal interface materials 1710, 1720 include the same material as the thermal interface material 450, however, the disclosure is not limited thereto. In some alternative embodiments, the material of the thermal interface material 450 and the thermal interface materials 1710, 1720 may be different, for example, selected as a function of the materials of the semiconductor package 200, the package frame 1500, and the heat exchanger 1800.

Figure 10B:
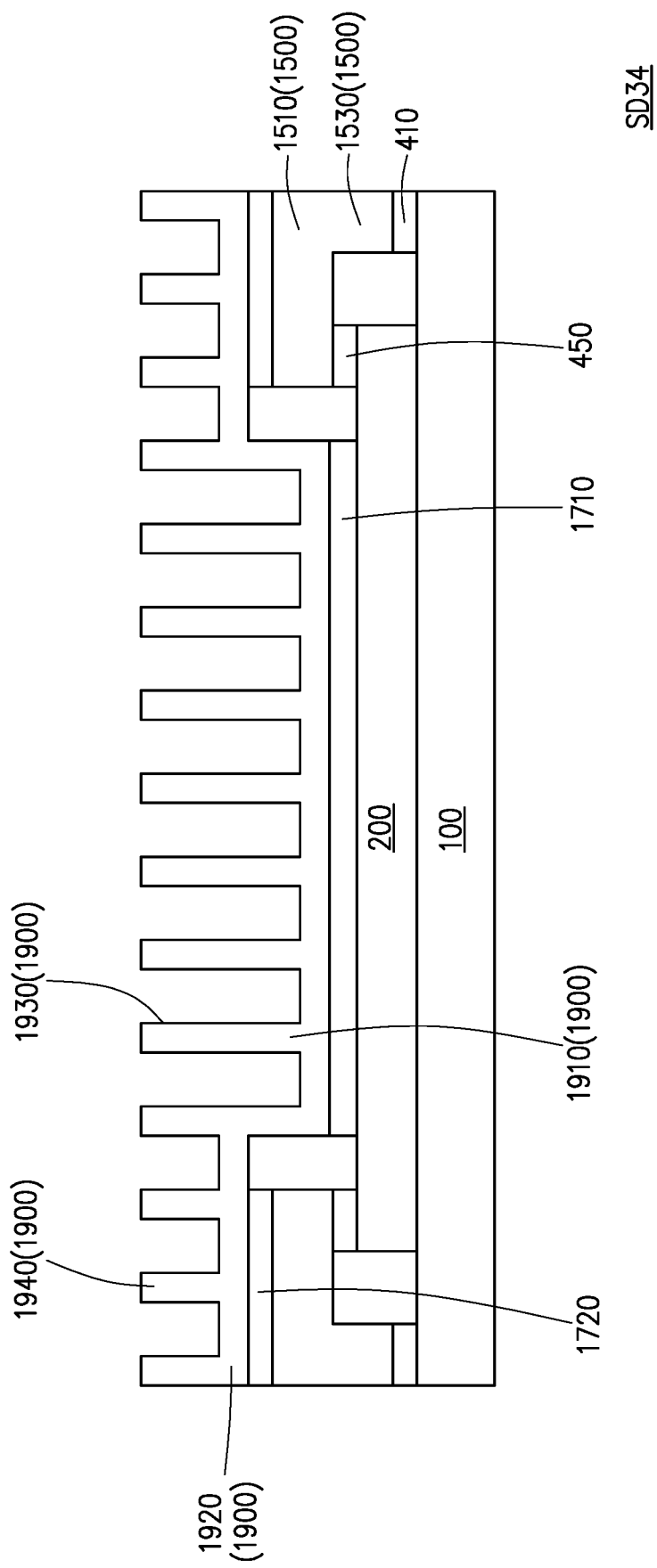
Figure 10C:
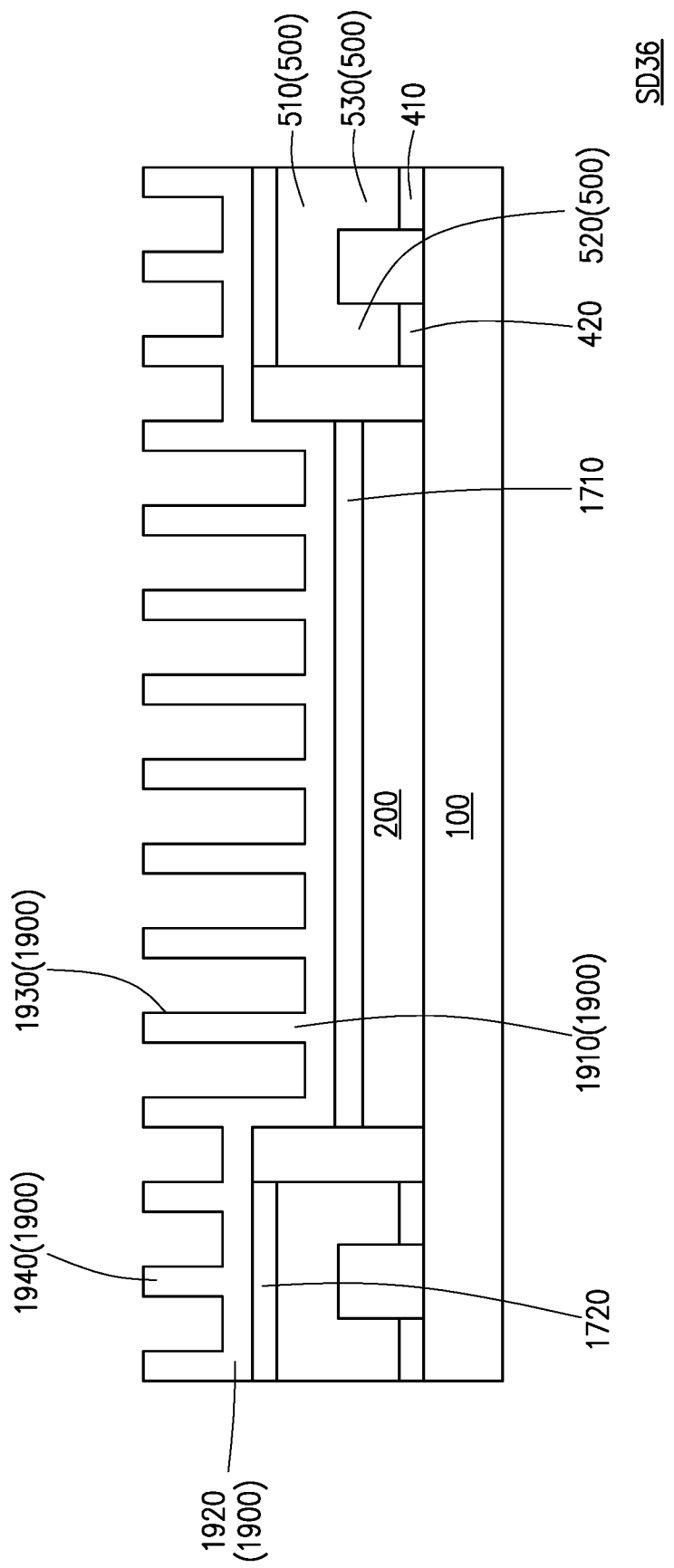

In some embodiments, the heat exchanger 1800 may be a heat sink, including a thicker plate portion 1810 extending on the thermal interface material 1710 on the semiconductor package 200, and a rim portion 1820 protruding at the level of the top surface of the plate portion 1810 from the plate portion 1810 to the package frame 1500. The rim portion 1820 may rest on the thermal interface material 1720 on the package frame 1500. In some embodiments, fins 1830 protrude from the plate portion 1810 and the rim portion 1820 to increase the contact area with the cooling fluid (e.g., air) so as to effectively dissipate heat generated by the semiconductor package 200 during usage. It will be apparent that the disclosure is not limited by the structure of the heat exchanger 1800. For example, in the semiconductor device SD34 illustrated in FIG. 10B, the heat exchanger 1900 has a plate portion 1910 of comparable thickness with the rim portion 1920, with longer fins 1930 protruding from the plate portion 1910 and thinner fins 1940 protruding from the rim portion 1920. In some embodiments, the fins 1930, 1940 may reach substantially a same level height over the circuit substrate 100. Naturally, the heat exchangers 1800, 1900 are not limited to be heat sinks. In some alternative embodiments, liquid cooling systems, plate heat exchangers, or the like may be used as heat exchangers 1800, 1900 according to application and performance requirements. It will be also apparent that heat exchangers may be applied to any one of the semiconductor devices described above or to be described in the following. For example, in FIG. 10C is illustrated the semiconductor device SD36, in which the heat exchanger 1900 is applied together with the additional thermal interface material 1710, 1720 on the semiconductor package 200 and the package frame 500 of the semiconductor device SD10 of FIG. 1D.

Figures 11A, 11B:
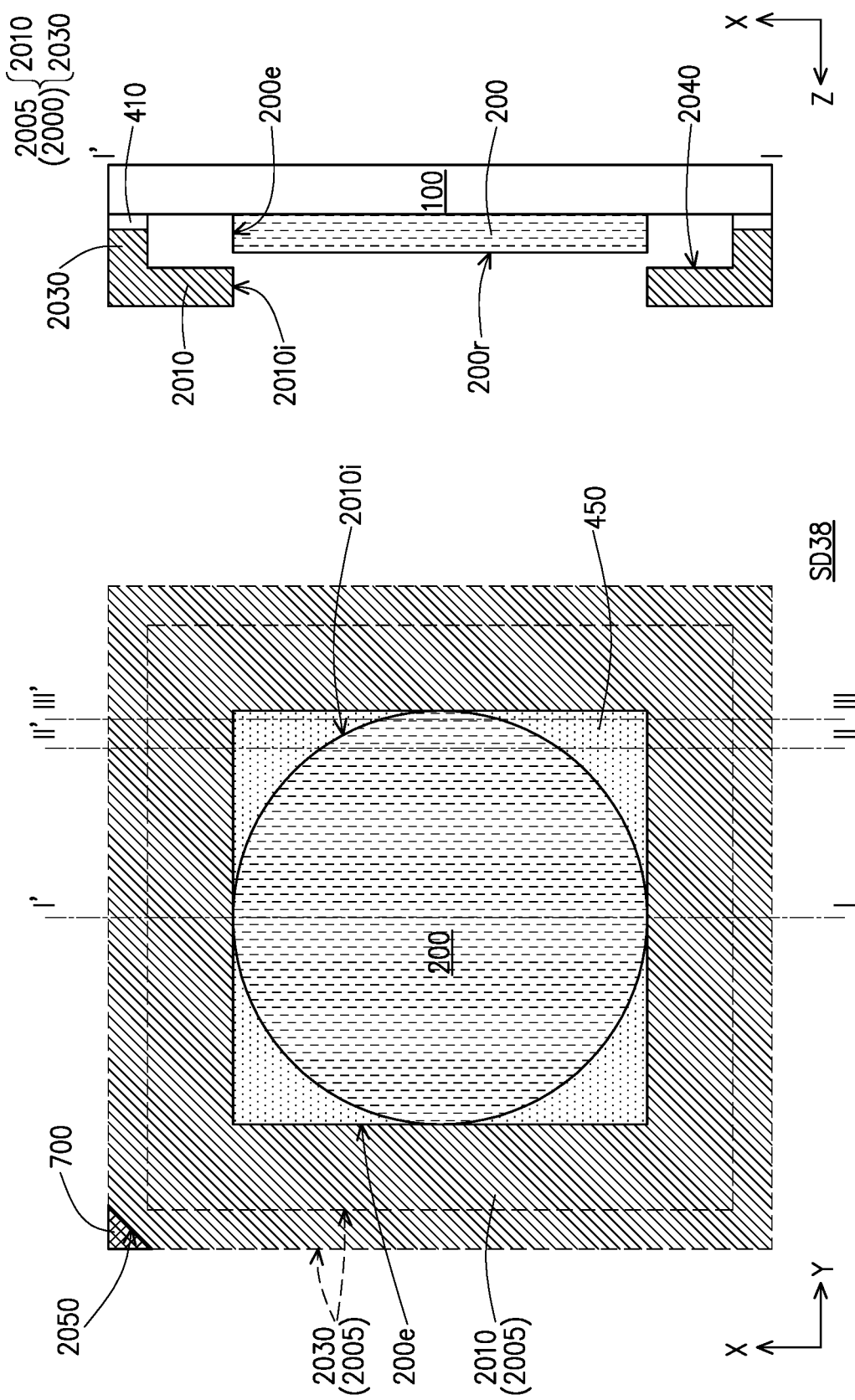
FIG. 11A is a schematic top view of a semiconductor device according to some embodiments of the disclosure.
FIG. 11B to FIG. 11D are schematic side views of the semiconductor device of FIG. 11A according to some embodiments of the disclosure.
Figure 11C:
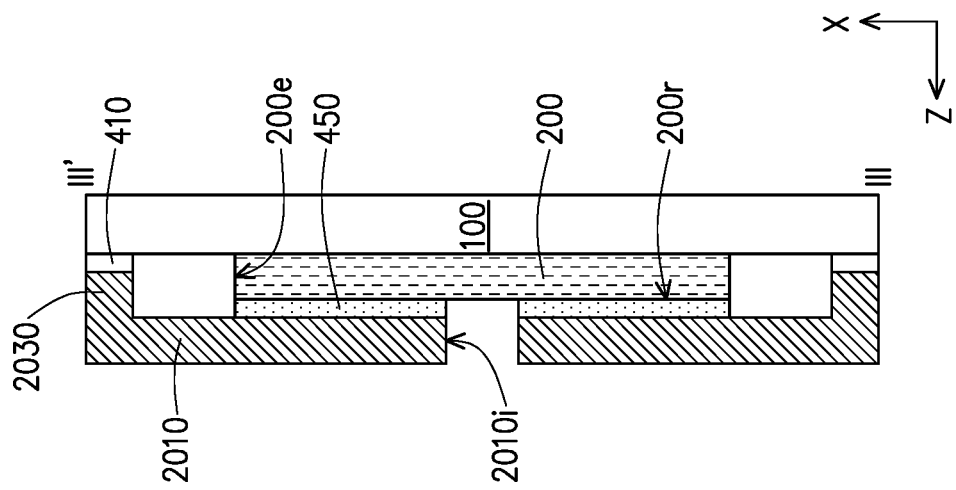
Figure 11D:
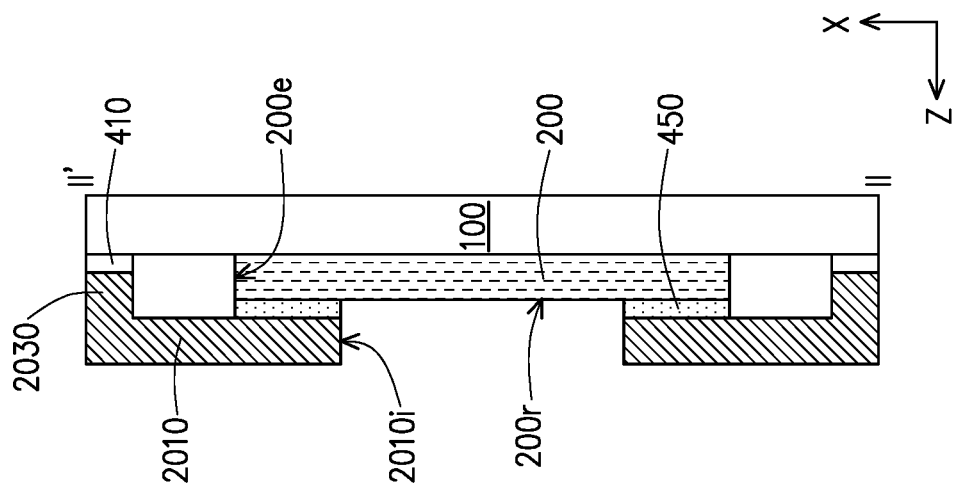

FIG. 11A is a schematic top view of a semiconductor device SD38 according to some embodiments of the disclosure. FIG. 11B to FIG. 11D are schematic side views of the semiconductor device SD38 respectively taken at the level height along the Y direction of the lines I-I', II-II', and III-III' illustrated in FIG. 11A. The side view of FIG. 11B is aligned with respect to the top view of FIG. 11A. In the side views of FIG. 11B to FIG. 11D some elements are illustrated in a simplified manner or even omitted. The semiconductor device SD38 may have a similar structure and be fabricated following a similar process as previously described for the semiconductor device SD28 of FIG. 8A. In some embodiments, the semiconductor device SD38 includes the package frame 2000 in which the roof portion 2005 including the roof 2010 and the outer flanges 2030 is disposed encircling the semiconductor package 200, with the side of the inner edge 2010i of the roof 2010 resting on thermal interface material 450 disposed on the semiconductor package 200, as previously described for the semiconductor package SD30 of FIG. 8A. In some embodiments, the inner edge 2010i of the roof 1610 describes a different shape than the inner edge 1510i of the roof 1510 of FIG. 8A. For example, the inner edge 2010i may have a circular profile, exposing a circular portion of the rear surface 200r of the semiconductor package 200. That is, the contact area between the package frame 2000 and the semiconductor package 200 may have different shapes at different level heights along the X and Y directions, following the profile of the inner edge 2010i. For example, at the level height of the line I-I' illustrated in FIG. 11B, the inner edge 2010i of the roof 2010 and the outer edge 200e of the semiconductor package 200 may substantially overlap, so that there may be a tiny gap between the roof 2010 and the semiconductor package 200. At other level heights, such as the ones of the lines II-II' and III-III' respectively illustrated in FIG. 11C and FIG. 11D, the roof 2010 may overlap to different extents with the semiconductor package 200. In some embodiments, the package frame 2000 may still contact the circuit substrate 100 in two concentric areas corresponding to the outer flanges 2030 and the area of overlap of the roof 2010 with the rear surface 200r of the semiconductor package 200. As explained above, the area of overlap may have any kind of shape. Based on the above, also in the semiconductor package SD38, the package frame 2000 describes an annular cavity 2040 encircling the semiconductor package 200. Depending on the shape of the inner edge 2010i and the footprint of the semiconductor package 200, the cavity 2040 may be closed or open (e.g., in view of the gap illustrated in FIG. 11B). In FIG. 11A the footprint of the outer flanges 1230 is indicated by dashed lines, and the area where the thermal interface material 450 is dispensed is indicated as a dotted area. In some embodiments, a corner 2050 of the package frame 2000 is cut for alignment purposes, as previously described.

Figures 12A, 12B:
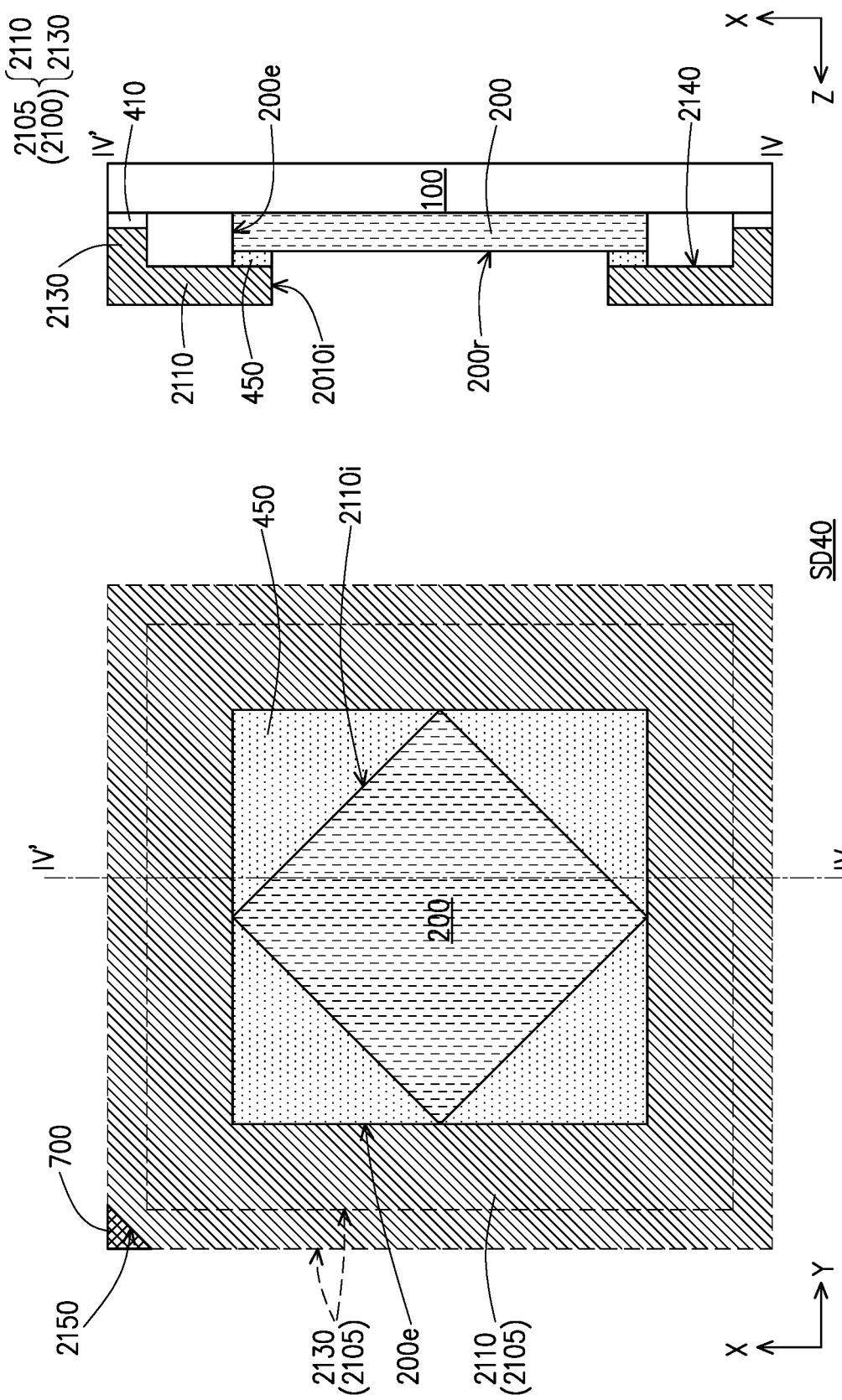
FIG. 12A and FIG. 13A are schematic top views of semiconductor devices according to some embodiments of the disclosure.
FIG. 12B and FIG. 13B are schematic side views of the semiconductor devices of FIG. 12A and FIG. 13A, respectively, according to some embodiments of the disclosure.

It will be apparent that the disclosure is not limited by the shape of the outline of the inner edge of the roof of the package frame. While in FIG. 11A the inner edge 2010i could be considered as defining a circle inscribed in the footprint of the semiconductor package 200, in alternative embodiments different shapes are possible. For example, in the semiconductor device SD40 of FIG. 12A and FIG. 12B, the inner edge 2110i of the roof 2110 of the package frame 2100 has a rhomboidal shape. The degree of overlap of the roof portion 2105 and the semiconductor package 200 may vary along the X and Y direction, as previously described with respect to FIG. 11A to FIG. 11D. At the level height of the line IV-IV' illustrated in FIG. 12B, the roof 2110 rests on the thermal interface material 450 on the semiconductor package 200, so that the roof 2110 defines, together with the semiconductor package 200, the circuit substrate 100 and the outer flanges 2130, the annular cavity 2140. Depending on the relative sizes of the opening defined by the inner edge 2110i and the footprint of the semiconductor package 200, the annular cavity 2140 may be closed or open. In FIG. 12A the footprint of the outer flanges 2130 are indicated by dashed lines, and the area where the thermal interface material 450 is located is indicated as a dotted area. In some embodiments, a corner 2150 of the package frame 2100 is cut for alignment purposes, as previously described.

Figures 13A, 13B:
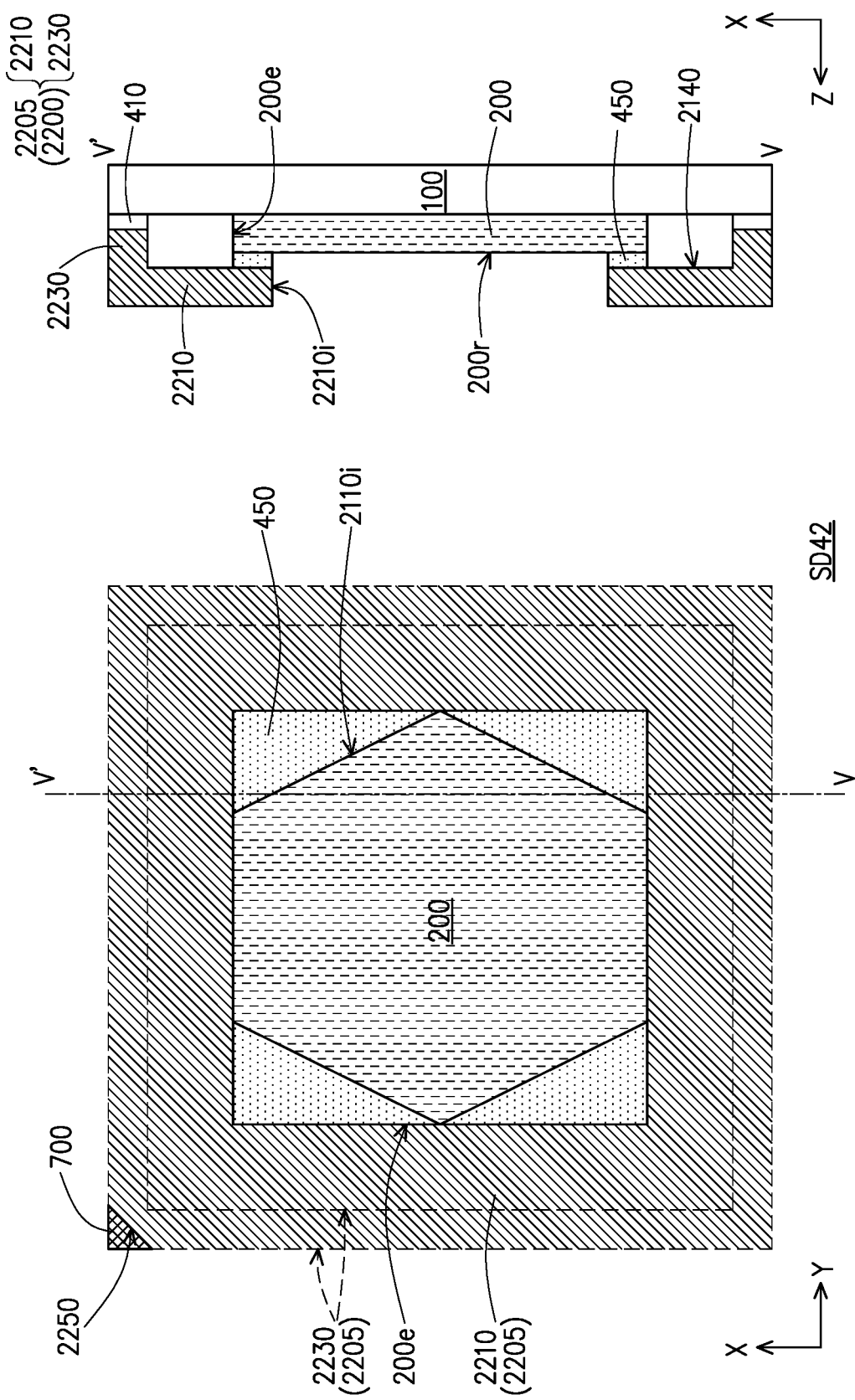

As another, non-limiting example, in FIG. 13A and FIG. 13B is illustrated the semiconductor device SD42, in which the inner edge 2210i of the roof 2210 of the package frame 2200 has a hexagonal shape. As in the previous embodiments, the degree of overlap of the roof portion 2205 and the semiconductor package 200 may vary along the X and Y direction, as described for example with respect to FIG. 11A to FIG. 11D. At the level height of the line V-V' illustrated in FIG. 13B, the roof 2210 rests on the thermal interface material 450 on the semiconductor package 200, so that the roof 2210 defines, together with the semiconductor package 200, the circuit substrate 100 and the outer flanges 2230, the annular cavity 2240. Depending on the relative sizes of the opening defined by the inner edge 2210i and the footprint of the semiconductor package 200, the annular cavity 2240 may be closed or open. In FIG. 12A the footprint of the outer flanges 2230 are indicated by dashed lines, and the area where the thermal interface material 450 is located is indicated as a dotted area. In some embodiments, a corner 2250 of the package frame 2200 is cut for alignment purposes, as previously described. Naturally, other polygonal shapes (e.g., pentagonal, heptagonal, etc.) are also contemplated within the scope of the disclosure. Furthermore, while in FIG. 11A to FIG. 13B the roof (e.g., the roof 2010 of FIG. 11B) and the outer flanges (e.g., the outer flanges 2030 of FIG. 11B) are illustrated as integrally formed, the disclosure is not limited thereto, and in some alternative embodiments, the roof and the outer flanges may be provided as separate pieces.

In accordance with some embodiments of the disclosure, a semiconductor device includes a circuit substrate, a semiconductor package, and a package frame. The semiconductor package is disposed on the circuit substrate. The package frame is disposed over the circuit substrate. The package frame encircles the semiconductor package. The semiconductor package has a first surface facing the circuit substrate and a second surface opposite to the first surface. The package frame leaves exposed at least a portion of the second surface of the semiconductor package. The package frame forms a cavity, which cavity encircles the semiconductor package.

In accordance with some embodiments of the disclosure, a semiconductor device comprises a circuit substrate, a semiconductor package, outer flanges, and a roof. The semiconductor package is bonded at a side of a front surface to the circuit substrate. The semiconductor package further has a rear surface opposite to the front surface. The outer flanges are attached to the circuit substrate and encircle the semiconductor package. The roof is disposed at a height over the circuit substrate. The roof has two support points to the circuit substrate. The two support points are disposed at opposite edges of the roof. The outer flanges support the roof at a first support point of the support points, at a side of an outer edge of the roof. An inner edge of the roof forms an opening exposing the rear surface of the semiconductor package.

In accordance with some embodiments of the disclosure, a manufacturing method of a semiconductor device is provided. The manufacturing method includes the following steps. A semiconductor package is bonded to a circuit substrate. A first adhesive is disposed on the circuit substrate. The first adhesive forms a first frame around the semiconductor package. A thermal interface material is disposed on a rear surface of the semiconductor package, along an edge of the semiconductor package. A package frame is adhered to the circuit substrate. The package frame includes outer flanges and a roof. The outer flanges are adhered to the first adhesive. The roof is adhered to the thermal interface material so as to cover the edge of the semiconductor package while exposing a central area of the rear surface of the semiconductor package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a circuit substrate;
   a semiconductor package disposed on the circuit substrate; and
   a package frame, disposed over the circuit substrate encircling the semiconductor package,
   wherein the semiconductor package has a first surface facing the circuit substrate and a second surface opposite to the first surface,
   the package frame leaves exposed at least a portion of the second surface of the semiconductor package, and
   the package frame forms a cavity, which the cavity encircles the semiconductor package,
   wherein the package frame comprises a roof overlying the cavity and outer flanges extending from the roof towards the circuit substrate, the roof extends on the outer flanges, and the outer flanges delimit a side of the cavity opposite with respect to the semiconductor package, wherein the package frame further comprises inner flanges encircling the semiconductor package and disposed between the semiconductor package and the outer flanges, wherein a material of the inner flanges has a lower coefficient of thermal expansion than a material of the outer flanges.

2. The semiconductor device of claim 1, wherein the roof extends on the semiconductor package at a side opposite with respect to the outer flanges.

3. The semiconductor device of claim 1, wherein the roof is integrally formed with the outer flanges.

4. The semiconductor device of claim 1, further comprising a first adhesive disposed between the outer flanges and the circuit substrate, and a second adhesive disposed between the inner flanges and the circuit substrate.

5. The semiconductor device of claim 1, further comprising an adhesive disposed between the roof and at least one selected from the inner flanges and the outer flanges.

6. The semiconductor device of claim 1, further comprising a heat exchanger contacting the portion of the second surface of the semiconductor package exposed by the package frame through a thermal interface material.

7. The semiconductor device of claim 1, further comprising a surface mount device connected to the circuit substrate and disposed within the cavity, whereby the roof overlies the surface mount device.

8. The semiconductor device of claim 1, wherein the inner flanges extends from the roof towards the circuit substrate,
the inner flanges delimit a side of the cavity opposite with respect to the outer flanges, and
the inner flanges are separated from the semiconductor package by a gap.

9. The semiconductor device of claim 1, wherein the material of the inner flanges is or includes stainless steel.

10. The semiconductor device of claim 1, further comprising an alignment mark disposed on the circuit substrate and having a complementary shape with respect to a cut corner of the package frame.

11. A semiconductor device, comprising:
a circuit substrate;
a semiconductor package bonded at a side of a front surface to the circuit substrate and further having a rear surface opposite to the front surface;
outer flanges, attached to the circuit substrate and encircling the semiconductor package;
a roof, disposed at a height over the circuit substrate and having two support points to the circuit substrate, wherein the two support points are disposed at opposite edges of the roof, the outer flanges support the roof at a first support point of the support points, at a side of an outer edge of the roof, and an inner edge of the roof forms an opening exposing the rear surface of the semiconductor package; and
inner flanges, attached to the circuit substrate and disposed between the semiconductor package and the outer flanges and supporting the roof at a second support point of the support points at a side of the inner edge of the roof, wherein a material of the inner flanges has a lower coefficient of thermal expansion than a material of the outer flanges.

12. The semiconductor device of claim 11, wherein the roof comprises the same material of the outer flanges, and the roof and the outer flanges are formed as a single piece.

13. The semiconductor device of claim 11, wherein the inner flanges extends from the roof towards the circuit substrate,
the inner flanges delimit a side of the cavity opposite with respect to the outer flanges, and
the inner flanges are separated from the semiconductor package by a gap.

14. The semiconductor device of claim 11, wherein the material of the inner flanges is or includes stainless steel.

15. The semiconductor device of claim 11, further comprising an alignment mark disposed on the circuit substrate and having a complementary shape with respect to a cut corner of the package frame.

16. A manufacturing method of a semiconductor device, comprising:
bonding a semiconductor package to a circuit substrate;
disposing a first adhesive on the circuit substrate, wherein the first adhesive forms a first frame around the semiconductor package; and
adhering a package frame to the circuit substrate, wherein the package frame comprises outer flanges and a roof, the outer flanges are adhered to the first adhesive, and the roof extends on the outer flanges while exposing a central area of a rear surface of the semiconductor package,
wherein the package frame further comprises inner flanges encircling the semiconductor package and disposed between the semiconductor package and the outer flanges,
wherein a material of the inner flanges has a lower coefficient of thennal expansion than a material of the outer flanges.

17. The manufacturing method of claim 16, wherein adhering the package frame comprises:
adhering the outer flanges to the first adhesive;
disposing a second adhesive on the outer flanges; and
adhering the roof to the second adhesive at one side and to the inner flanges at an opposite side.

18. The manufacturing method of claim 16, wherein the roof and the outer flanges are integrally formed.

19. The manufacturing method of claim 16, further comprising bonding a surface mount device to the circuit substrate beside the semiconductor package, wherein the first adhesive is disposed further away from the semiconductor package than the surface mount device, and the roof is disposed so as to extend over the surface mount device.

20. The manufacturing method of claim 16, further comprising:
disposing additional thermal interface material on the central area of the semiconductor package; and
disposing a heat exchanger on the additional thermal interface material.

* * * * *